United States Patent
Li

(10) Patent No.: US 12,302,598 B2
(45) Date of Patent: May 13, 2025

(54) SEMICONDUCTOR DEVICE AND METHOD OF MANUFACTURING THE SAME

(71) Applicant: GUANGDONG ZHINENG TECHNOLOGIES, CO. LTD., Guangdong (CN)

(72) Inventor: Zilan Li, Guangdong (CN)

(73) Assignee: GUANGDONG ZHINENG TECHNOLOGIES, CO. LTD., Guangdong (CN)

( * ) Notice: Subject to any disclaimer, the term of this patent is extended or adjusted under 35 U.S.C. 154(b) by 654 days.

(21) Appl. No.: 17/603,298

(22) PCT Filed: Jan. 17, 2020

(86) PCT No.: PCT/CN2020/072766
§ 371 (c)(1),
(2) Date: Oct. 12, 2021

(87) PCT Pub. No.: WO2020/207098
PCT Pub. Date: Oct. 15, 2020

(65) Prior Publication Data
US 2022/0199819 A1      Jun. 23, 2022

(30) Foreign Application Priority Data
Apr. 12, 2019  (CN) .......................... 201910291624.6

(51) Int. Cl.
*H01L 29/778* (2006.01)
*H10D 30/01* (2025.01)
(Continued)

(52) U.S. Cl.
CPC ......... *H10D 30/475* (2025.01); *H10D 30/015* (2025.01); *H10D 62/117* (2025.01);
(Continued)

(58) Field of Classification Search
CPC . H01L 29/045; H01L 29/0657; H01L 27/085; H01L 27/092; H01L 21/825;
(Continued)

(56) References Cited

U.S. PATENT DOCUMENTS

2009/0108303 A1* 4/2009 Pfirsch ................ H01L 29/7806
257/E29.313
2012/0305987 A1* 12/2012 Hirler ................. H01L 29/7789
257/E21.454
(Continued)

FOREIGN PATENT DOCUMENTS

CN      105679823 A      6/2016
CN      106549038 A      3/2017
(Continued)

OTHER PUBLICATIONS

Machine translation of Takemoto et al. JP 2018093027 (Year: 2018).*

*Primary Examiner* — Yasser A Abdelaziz
(74) *Attorney, Agent, or Firm* — Seed IP Law Group LLP

(57) ABSTRACT

The present disclosure relates to a semiconductor device, comprising: a groove; a first channel layer positioned within the groove; and a first barrier layer positioned within the groove, wherein a first heterojunction having a vertical interface is included between the first channel layer and the first barrier layer and 2DEG or 2DHG is formed in the first heterojunction. The present disclosure also relates to a method of manufacturing a semiconductor device.

27 Claims, 32 Drawing Sheets

(51) Int. Cl.
*H10D 30/47* (2025.01)
*H10D 62/10* (2025.01)
*H10D 62/40* (2025.01)
*H10D 62/832* (2025.01)
*H10D 62/85* (2025.01)

(52) U.S. Cl.
CPC ....... *H10D 62/405* (2025.01); *H10D 62/8325* (2025.01); *H10D 62/8503* (2025.01)

(58) Field of Classification Search
CPC ......... H01L 29/66431; H01L 29/66462; H01L 29/7788; H01L 21/823885; H01L 27/0605; H01L 29/1029; H01L 29/41741; H01L 29/7786; H01L 29/42316; H01L 29/7789; H01L 29/1608; H01L 29/2003
See application file for complete search history.

(56) References Cited

U.S. PATENT DOCUMENTS

2014/0367695 A1* 12/2014 Barlow ............. H01L 21/30608
257/194
2021/0143270 A1* 5/2021 Chang ............... H01L 29/66462

FOREIGN PATENT DOCUMENTS

| CN | 108511513 A | | 9/2018 |
|---|---|---|---|
| JP | 2018093027 | * | 6/2018 |
| JP | 2018093027 A | | 6/2018 |
| KR | 20140013618 A | | 2/2014 |

* cited by examiner

Fig. 5AA
Fig. 5AB

SEMICONDUCTOR DEVICE AND METHOD OF MANUFACTURING THE SAME

FIELD OF THE DISCLOSURE

The present disclosure relates to a semiconductor device, especially a nitride semiconductor device.

BACKGROUND OF THE DISCLOSURE

Group III nitride semiconductors, including AlN, GaN, InN and compounds of these materials such as AlGaN, InGaN, AlInGaN and the like are important semiconductor materials. Due to their advantages like direct band gap, wide forbidden band and high breakdown electric field intensity, Group III nitride semiconductors represented by GaN have broad application prospects in the fields of light-emitting devices, power electronics and radio frequency devices.

Unlike conventional non-polar semiconductor materials such as Si, Group III nitride semiconductors have polarity. In other words, they are polar semiconductor materials. Polar semiconductors have many unique properties. Particularly importantly, fixed polarized charges are present at a surface of the polar semiconductor or at an interface of two different polar semiconductors. These fixed polarized charges may attract movable electrons or hole carriers and thus form the two-dimensional electron gas (2DEG) or the two-dimensional hole gas (2DHG). The generation of 2DEG or 2DHG neither requires an additional electric field, nor depends on a doping effect in the semiconductor. It is spontaneously generated. The 2DEG or 2DHG at the interface of the polar semiconductors may have a high surface charge density. Meanwhile, without doping, the 2DEG or the 2DHG has high mobility because of reduction of ion scattering effect and so on that the 2DEG or the 2DHG is usually subjected to undertake. The high density of the surface charge and high mobility enable the 2DEG or 2DHG spontaneously generated at those interfaces to have good conductivity and high response speed.

In combination with inherent advantages of the nitride semiconductor such as high breakdown electric field and so on, the 2DEG or 2DHG may be used to manufacture high mobility transistors. Their performances in high energy, high voltage or high frequency applications are significantly better than those traditional Si or GaAs devices. However, existing structures have many defects, which seriously restricts their application ranges.

SUMMARY OF THE DISCLOSURE

This disclosure relates to a semiconductor device, comprising: a groove; a first channel layer positioned within the groove; and a first barrier layer positioned within the groove, wherein a first heterojunction having a vertical interface is included between the first channel layer and the first barrier layer and 2DEG or 2DHG is formed in the first heterojunction.

In the semiconductor device as described herein, the first channel layer and the first barrier layer are two kinds of nitride semiconductor with different forbidden band widths.

The semiconductor device as described herein further comprises a substrate positioned under the groove.

In the semiconductor device as described herein, at least a part of a sidewall of the groove is a part of the substrate.

In the semiconductor device as described herein, at least a part of the sidewall of the groove is a (111) plane of Si, a (0001) plane of sapphire Al2O3, a (0001) or (000-1) plane of SiC, or a (0001) or (000-1) plane of intrinsic GaN.

In the semiconductor device as described herein, the substrate is Si.

In the semiconductor device as described herein, a nucleation layer is included in the groove.

The semiconductor device as described herein further comprises a first separating layer formed between the bottom of the groove and the first channel layer.

The semiconductor device as described herein further comprises a second separating layer formed between the bottom of the groove and the first barrier layer.

The semiconductor device as described herein further comprises a first electrode being electrically connected with 2DEG or 2DHG of the first heterojunction; and a second electrode being electrically connected with 2DEG or 2DHG of the first heterojunction; wherein one of the first electrode and the second electrode is in Schottky contact and the other is in ohmic contract.

The semiconductor device as described herein further comprises a first electrode being electrically connected with 2DEG or 2DHG of the first heterojunction; a second electrode being electrically connected with 2DEG or 2DHG of the first heterojunction; and a third electrode between the first electrode and the second electrode, configured to control current intensity between the first electrode and the second electrode.

The semiconductor device as described herein further comprises a gate insulating layer positioned between the third electrode and the first heterojunction.

In the semiconductor device as described herein, a stop layer is included on a sidewall of the groove adjacent to an electrode.

The semiconductor device as described herein further comprises a second channel layer and a second barrier layer, wherein a second heterojunction having a vertical interface is included between the second channel layer and the second barrier layer and 2DEG or 2DHG is formed in the second heterojunction.

The semiconductor device as described herein further comprises a screening layer between the first channel layer/ the first barrier layer and the second channel layer/the second barrier layer.

The semiconductor device as described herein further comprises a spacing layer formed on the bottom of the groove under the screening layer, the spacing layer extends horizontally.

The semiconductor device as described herein further comprises a first electrode being electrically connected with 2DEGs or 2DHGs of the first heterojunction and the second heterojunction; and a second electrode being electrically connected with 2DEGs or 2DHGs of the first heterojunction and the second heterojunction; wherein one of the first electrode and the second electrode is in Schottky contact and the other is in ohmic contract.

a first electrode being electrically connected with 2DEGs or 2DHGs of the first heterojunction and the second heterojunction; a second electrode being electrically connected with 2DEGs or 2DHGs of the first heterojunction and the second heterojunction; and a third electrode between the first electrode and the second electrode, configured to control current intensity between the first electrode and the second electrode.

In another aspect of the present disclosure, it provides a method of manufacturing a semiconductor device, comprising forming a first groove in the substrate; forming a first channel layer within the first groove; forming a second groove in the substrate, the second groove having a side of the first channel layer exposed; and forming a first barrier layer within the second groove, wherein a first heterojunction having a vertical interface is included between the first channel layer and the first barrier layer and 2DEG or 2DHG is formed in the first heterojunction.

The method as described herein further comprises forming a first separating layer on the bottom of the first groove.

The method as described herein further comprises forming a second separating layer on the bottom of the second groove.

The method as described herein further comprises forming a first spacing layer on a sidewall of the first groove.

The method as described herein further comprises forming a second spacing layer on a sidewall of the second groove.

The method as described herein further comprises forming a first electrode being electrically connected with 2DEG or 2DHG of the first heterojunction; and forming a second electrode being electrically connected with 2DEG or 2DHG of the first heterojunction; wherein one of the first electrode and the second electrode is in Schottky contact and the other is in ohmic contract.

The method as described herein further comprises forming a first electrode being electrically connected with 2DEG or 2DHG of the first heterojunction; forming a second electrode being electrically connected with 2DEG or 2DHG of the first heterojunction; and forming a third electrode between the first electrode and the second electrode, configured to control current intensity between the first electrode and the second electrode.

The method as described herein further comprises forming a gate insulating layer between the first heterojunction and the third electrode before forming the third electrode.

The method as described herein further comprises etching off all or a part of a substrate as a sidewall of the first groove and/or the second groove; and forming a screening layer as the sidewall of the first groove and/or the second groove.

The method as described herein further comprises forming a third groove in the substrate; forming a second channel layer within the third groove; forming a fourth groove in the substrate, the fourth groove having a side of the second channel layer exposed; and forming a second barrier layer within the fourth groove, wherein a second heterojunction having a vertical interface is included between the second channel layer and the second barrier layer and 2DEG or 2DHG is formed in the second heterojunction.

The method as described herein further comprises forming a screening layer between the first channel layer/the first barrier layer and the second channel layer/the second barrier layer.

The method as described herein further comprises forming a spacing layer on the bottom of the groove under the screening layer, wherein the spacing layer extends horizontally.

The method as described herein further comprises forming a first electrode being electrically connected with 2DEGs or 2DHGs of the first heterojunction and the second heterojunction; and forming a second electrode being electrically connected with 2DEGs or 2DHGs of the first heterojunction and the second heterojunction; wherein one of the first electrode and the second electrode is in Schottky contact and the other is in ohmic contract.

The method as described herein further comprises forming a first electrode being electrically connected with 2DEGs or 2DHGs of the first heterojunction and the second heterojunction; forming a second electrode being electrically connected with 2DEGs or 2DHGs of the first heterojunction and the second heterojunction; and forming a third electrode between the first electrode and the second electrode, configured to control current intensity between the first electrode and the second electrode.

DETAILED DESCRIPTION OF THE EMBODIMENT(S) OF THE DISCLOSURE

Figure 1A:
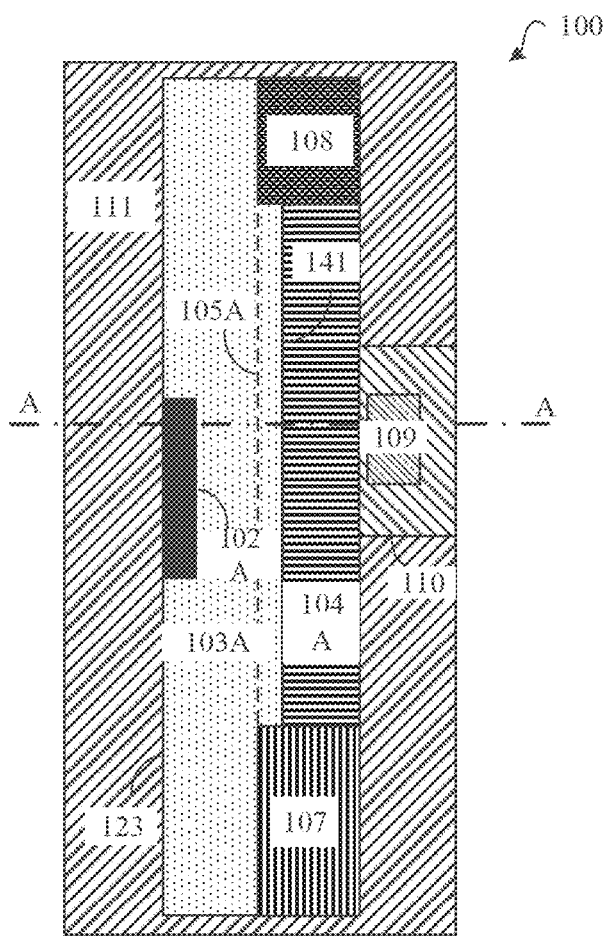
FIG. 1A is a top view of a single-channel HEMT according to an embodiment of the present disclosure.

In order that the objects, technical solutions and advantages of the embodiments of the present disclosure will become clearer, technical solutions in the embodiments of the present disclosure will be described clearly and completely below in conjunction with the drawings in the embodiments of the present disclosure. Apparently, the described embodiments are some of the embodiments of the present disclosure, not all of them. All the other embodiments obtained by those skilled in the art based on the embodiments of the present disclosure without creative efforts will fall within the scope of the present disclosure.

In the following detailed description, reference may be made to various drawings which constitute a part of the present application and serve to explain the present application. In the drawings, similar reference signs denote substantially similar components in different figures. The individual specific embodiments of the present application will be described in sufficient detail below to enable those of ordinary knowledge and skills in the art to carry out the technical solutions of the present application. It is understood that other embodiments may be utilized, or structural, logical or electrical changes may be made to the embodiments of the present application.

The present disclosure provides a semiconductor device.

Figure 1B:
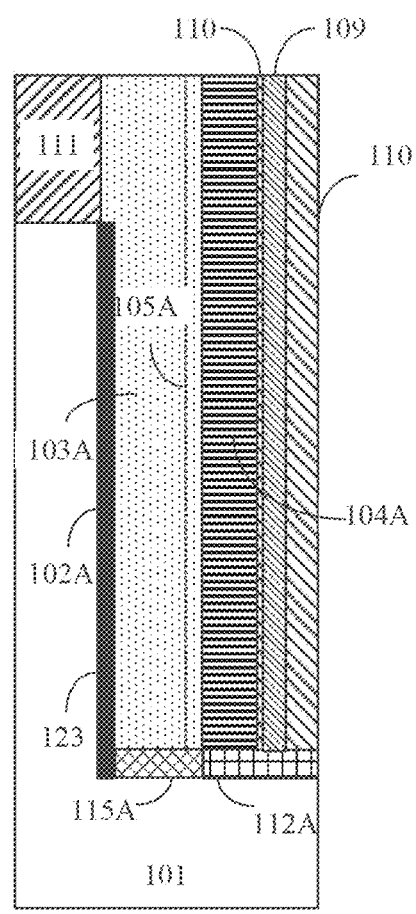
FIG. 1B is a sectional view of a single-channel HEMT according to an embodiment of the present disclosure.

FIG. 1A is a top view of a single-channel HEMT according to an embodiment of the present disclosure; and FIG. 1B is a sectional view of a single-channel HEMT according to an embodiment of the present disclosure, which shows the sectional view at the position along the dot dash line A-A. The semiconductor device 100 comprises a groove 123. As shown in FIG. 1A, the groove 123 presents a rectangle shape. As shown in FIG. 1B, the groove 123 extends from top to bottom, producing internal room. As shown in the figures, a channel layer 103A and a barrier layer 104A extending along the vertical direction are included in the groove 123. A vertical interface 141 is formed between the channel layer 103A and the barrier layer 104A. Because the channel layer 103A and the barrier layer 104A have different energy band gaps, a heterojunction having a vertical interface 141 is formed within the groove 123. A vertical two-dimensional electron gas 2DEG 105A is formed in the heterojunction.

In some embodiments, the groove 123 may present other shapes like a triangle or circle at the surface of the semiconductor device 100. In some embodiments, after some specific processes (for example removal of the substrate), the groove 123 may extend from one side of the semiconductor device 100 to the other side thereof, which generating a passthrough structure. Those changes are also within scope of the present disclosure.

The devices having the groove structure related to the present disclosure have the following advantages: a device which is difficult to be implemented with ordinary methods may be formed by forming a groove structure according to requirements of a practical device to meet the requirements and then forming the device step by step within the groove structure. For example, it is easy to form a low ratio of width to height by epitaxial growth in the art, such as growing a thin film on a plane. However, it is often very difficult to form a high ratio of width to height. As an example, in case the vertical height is big and the width is small in the structure in FIG. 1B, it is very difficult to be accomplished by traditional epitaxial growth. As shown with some embodiments of the present disclosure, such structure is easy to realize by the groove structure provided by the present disclosure.

In some embodiments, the ratio of width to height of the channel layer and the barrier layer of the semiconductor device of the present disclosure may be 1:5, 1:10, or 1:100. For example, the width of both of the bottom of the channel layer 103A and the barrier layer 104A is 1 μm (micro meter), the height of the channel layer 103A and the barrier layer 104A may be 5 μm, 10 μm, or 100 μm. In practice, after defined by the groove, any desire ratio of width to height can be realized by means of the groove.

In some embodiments, the groove 123 is formed in a substrate 101. For example, the substate 101 is etched to form the groove 123. The lattice of the exposed surface of the substrate 101 has hexagonal symmetry such that the nitride semiconductor crystal can be epitaxially grown later. For example, the exposed vertical surface of the substrate 101 may be a (111) plane of Si, a (0001) plane of sapphire $Al_2O_3$, a (000-1), or (0001) plane of SiC, or a (000-1), or (0001) plane of intrinsic GaN. Further, the corresponding substrate may be a Si substrate, a sapphire $Al_2O_3$ substrate, a SiC substrate, or an intrinsic GaN substrate.

The widths of the channel layer 103A and the barrier layer 104A may be adjusted according to practical requirements. In the channel layer 103A, 2DEG 105A is formed adjacent to the vertical interface 141 between the channel layer 103A and the barrier layer 104A.

In some embodiments, the channel layer 103A and the barrier layer 104A is lower than the groove 123. In some specific applications, the channel layer 103A and the barrier layer 104A may extend higher than the groove 123 although it is difficult to control the growth of the channel layer 103A and the barrier layer 104A without the definition of the groove 123. The height outside of the groove 123 is limited even if the channel layer 103A and the barrier layer 104A have been higher than the groove 123.

In some growth conditions, the surface of the channel layer and the barrier layer on the Si (111) and $Al_2O_3$ (0001) is also (0001) plane. That is, the direction from the Si and $Al_2O_3$ substrate to the channel layer and the barrier layer is <0001> crystal orientation. With such crystal orientation, there is 2DEG in the channel layer adjacent to the interface between the channel layer and the barrier layer. On opposite, there is 2DHG in the channel layer adjacent to the interface between the channel layer and the barrier layer in <000-1> crystal orientation.

In some embodiments, HEMT 100 further comprises a nucleation layer 102A. The nucleation layer 102A is formed on the vertical surface of the substrate 101. In some embodiments, the nucleation layer 102A may be AlN. Because of shadowing of the channel layer, the nucleation layer 102A is invisible in FIG. 1A. The position of the nucleation layer 102A is shown schematically in FIG. 1A to facilitate the understanding.

In some embodiments, HEMT 100 further comprises a buffer layer (not shown). The buffer layer is formed on the nucleation layer 102A. For example, the buffer layer may be in structure of one layer or multiple layers, including one or more of AlN, GaN, AlGaN, InGaN, AlInGaN.

In some embodiments, the semiconductor device 100 comprises a first electrode 107 and a second electrode 108. The first electrode 107 and a second electrode 108 are electrically connected with 2DEG 105A. For example, one of the first electrode 107 and the second electrode 108 is in ohmic contact with the channel layer 103A and/or the barrier layer 104A; the other is in Schottky contact with the channel layer 103A and/or the barrier layer 104A, and thereby forming a Schottky diode.

The HEMT 100 further comprises a third electrode 109. The third electrode 109, provided between the first electrode 107 and the second electrode 108, is also called the gate electrode and controls current intensity in the channel area between the first electrode 107 and the second electrode 108, forming the HEMT structure. As shown in FIG. 1B, the height of the third electrode 109 is not lower than that of 2DEG 105A to realize control of current channel between the first electrode 107 and the second electrode 108. In some emdodiments, in case the first electrode 107 as a drain is connected to the high voltage, the third electrode may be positioned between the first electrode 107 and the second electrode 108 and be more adjacent to the second electrode 108 (a source). This arrangement increases the distance between the drain and the gate, which can effectively enhance withstanding voltage of the semiconductor device 100.

The voltage of the third electrode 109 may control the depth of the heterojunction formed by the channel layer-the barrier layer, control the density of surface charge of the 2DEG in the potential well, and further control the working current between the first electrode 107 and the second electrode 108. In some embodiments, a gate insulating layer 110 is included outside of the barrier layer 104A. The third electrode 109 is contacted with the gate insulating layer 110 and is not directly contacted with the barrier layer 104A.

FIG. 1A shows an arrangement of the three electrodes of the HEMT 100. The first electrode 107 and the second electrode 108 are located at almost the same position within the scope of the groove 123 in the above of the channel layer 103A and/or the barrier layer 104A. The gate insulating layer 110 is included outside of the barrier layer 104A. The third electrode 109 is set outside of the gate insulating layer 110. The third electrode 109 is also within the groove 123. In this way, the wafer area occupied can be decreased and the integrity can be enhanced. Further, all three electrodes are positioned on the upper surface of the device, which will facilitate the wiring thereafter and integrity. In some embodiments, the gate insulating layer 110 covers the third electrode 109, which can make the substate 101 separated and facilitate simplification of manufacturing processes.

In another aspect, as shown in FIG. 1B, the groove 123 may be very deep, which further forms very high 2DEG 105A. The HEMT made in this way can easily have higher power because the conductive current between the source and the drain is bigger in the condition that the distance between the electrodes are not changed.

In some embodiments, on the sidewall of the groove 123, a separating layer (not shown) may be included between the substrate 101 and the channel layer 103A. It may embrace the channel layer 103A and its material may be insulating materials such as $SiO_2$, etc. The separating layer makes the channel layer 103A separated from the sub state 101, which can avoid influence of the substrate 101 to the performance of the device and is obviously helpful to enhance the withstanding voltage and to reduce the dark current.

In some embodiments, on the bottom of the groove 123, a separating layer 115A is included between the substrate 101 and the channel layer 103A. The separating layer 115A extends horizontally and its material may be insulating materials such as $SiO_2$, etc. The separating layer 115A makes the channel layer 103A separated from the sub state 101, which can avoid influence of the substrate 101 to the performance of the device and is obviously helpful to enhance the withstanding voltage and to reduce the dark current.

In some embodiments, on the bottom of the groove 123, a separating layer 112A is included between the substrate 101 and the barrier layer 104A. The separating layer 112A extends horizontally and its material may be insulating materials such as $SiO_2$, etc. The separating layer 112A makes the barrier layer 104A separated from the sub state 101, which can avoid influence of the substrate 101 to the performance of the device and is obviously helpful to enhance the withstanding voltage and to reduce the dark current.

In order to enhance capacity of voltage withstanding of the device 100 and reduce the influence of the substate 101, in some embodiments, the sidewall of the groove which embrace externally the channel layers 103A and 103B or a part of the same may be non-substrate material, for example a blocking layer 111. Its material may be insulating materials such as $SiO_2$, etc. In some embodiments, as shown in FIGS. 1A and 1B, all the surface of the substrate is covered by the blocking layer 111. The groove 123 is formed by partially removal of the blocking layer 111. Therefore, the blocking layer 111 embraces the groove 123 and a part of the same becomes the sidewall of the groove 123. In some embodiments, the sidewall of the groove 123 are all made by the blocking layer 111. In another embodiments, the blocking layer 111 embrace the first electrode 107 and the second electrode 108 and makes the first electrode 107 and the second electrode 108 separated from the substrate 101. For example, a part of the substrate which embraces the first electrode 107 and/or the second electrode 108 are removed and then the blocking layer 111 is deposited. The blocking layer 111 can avoid influence of the substrate 101 to the performance of the device. Meanwhile, it also provides protection to the semiconductor device 100 and increase durability of the device.

According to some embodiments of the present disclosure, the substrate 101 can be the Si substrate with low costs and matured manufacturing processes. Because of the Si substrate, a nucleation layer 102A with material of AlN is introduced. In some embodiments, a buffer layer 103A is also introduced to alleviate influence of the lattice difference. The buffer layer 105 may be one or more of AlN, GaN, AlGaN, InGaN, AlInGaN. The channel layer 103A may be GaN and the barrier layer 104A may be AlGaN. In some embodiments, the material of the screening layer 110, the blocking layer 111, the separating layer 112A and the separating layer 115A may be at least one kind of insulating material such as oxide of silicon, oxide of silicon nitride, silicon nitride, with one or multiple layers structure.

The present disclosure has a number of advantages like high figurability. In the growth of traditional processes, crystal is likely to grow vertically, which makes it difficult to produce some specific size ratios or structures. After introduction of the grooves, the crystal will grow along the shape of grooves. Therefore, the technical solution of the present disclosure can form the device structure with relatively high ratio of height to width which is difficult to be produced by ordinary processes. Moreover, the manufacturing processes is more simplified. The structure with relatively high ratio of height to width may realize higher density of vertical channels on the flat size, reduce resistance of the device, and improve performance of the device.

In some aspects, it is very difficult to make a semiconductor structure grown completely vertically and it is possible to present multiple growth surfaces because of no limitation to the crystal growth. The structure of the present disclosure may keep continuous growth on one surface and improve electrical performance of the device. The growth of a traditional device usually be done from bottom to top in the vertical direction. The structure of the present disclosure grows horizontally. A plurality of device may be formed in the same groove, which not only reduce manufacturing costs and save manufacturing working time but also significantly improve integrity on the flat size of the substrate. Further, in some embodiments, the electrodes are in the plane structure and on the top of the device, which facilitate the arrangement and lining. The structure of the present disclosure may be applied in many kinds of semiconductor devices, for example HEMTs, HHMTs, Schottky diodes, etc. The scope of application is wide.

As shown in some embodiments, the Si substrate with low costs and matured processes may be used in the present disclosure and its capability of voltage withstanding is close to a high electron mobility transistor with the intrinsic GaN substrate. Next, the contact area between the semiconductor device and the Si substrate is relatively small and it is not easy to have the problem of epitaxial layer fracturing which is likely to occur in traditional horizontal devices. Therefore, the cost of the semiconductor device of the present disclosure is lower.

it should be appreciated the above description only exemplarily shows the structure of high electron mobility transistor. There are many other structures or improvements, changes, or modifications on those structures for the devices related to the present disclosure to provide different properties or functions. Those structures and improvements, changes, or modifications on them are within the scope of technical concept of the present disclosure and may be also applied in the technical solutions of the present disclosure.

In some embodiments, the semiconductor device shown in FIGS. 1A and 1B is a HEMT. The similar structure can also be used to form a HHMT having 2DHG.

Figure 2A:
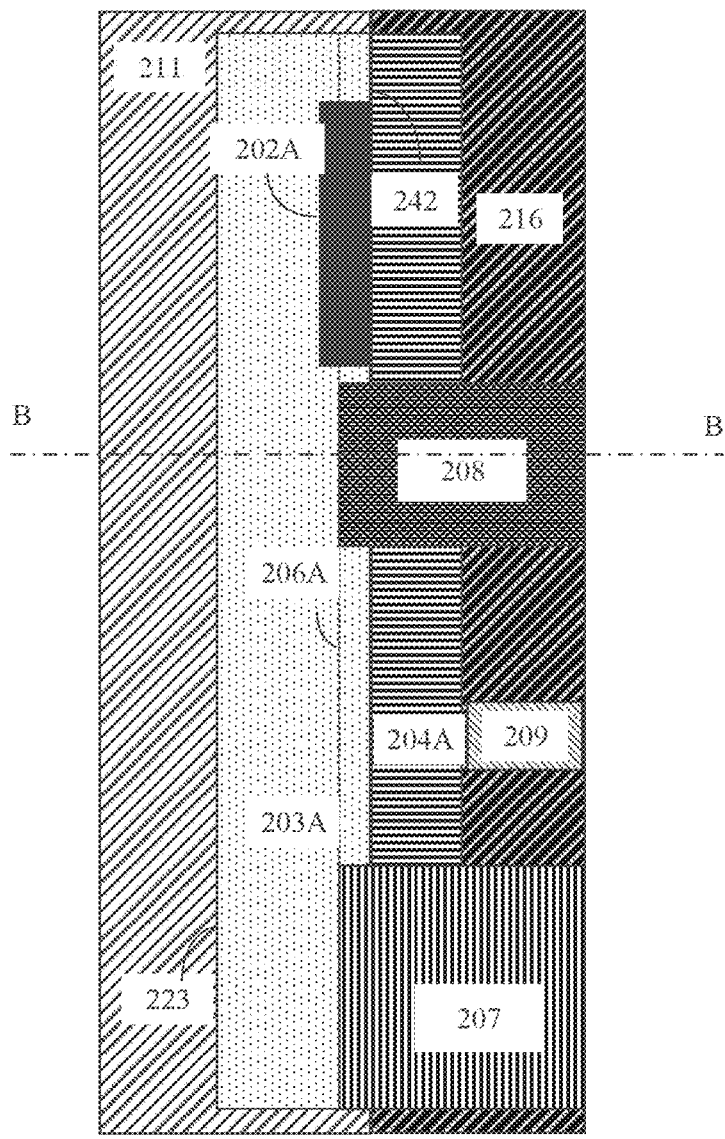
FIG. 2A is a top view of a single-channel HHMT according to an embodiment of the present disclosure.
Figure 2B:
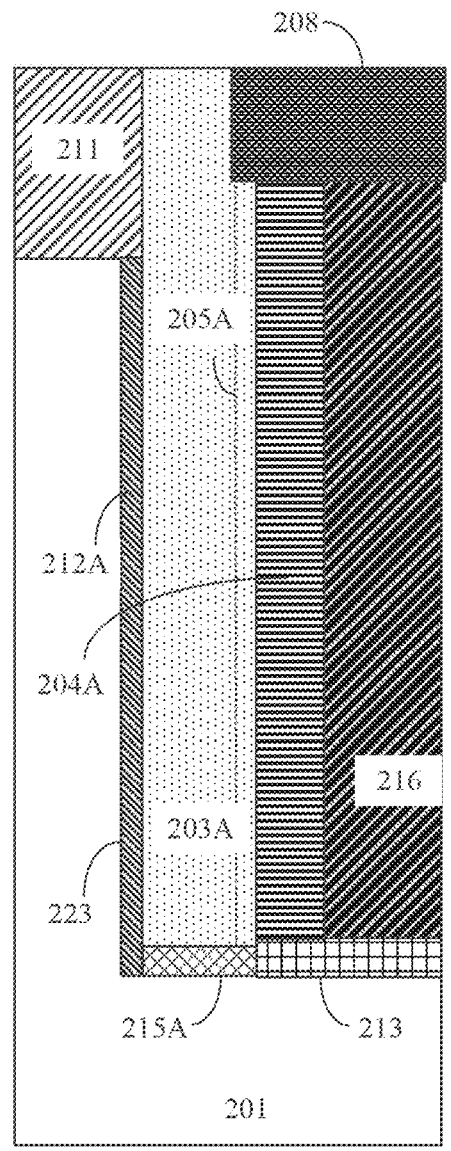
FIG. 2B is a sectional view of a single-channel HHMT according to an embodiment of the present disclosure.

FIG. 2A is a top view of a single-channel HHMT according to an embodiment of the present disclosure; and FIG. 2B is a sectional view of a single-channel HHMT according to an embodiment of the present disclosure, which shows the interface along the line B-B. The structures which are similar to those in FIGS. 1A and 1B are not repeated herein.

As shown in the figures, the semiconductor device 200 comprises a groove 223. A vertical interface 242 is formed between a channel layer 203A and a barrier layer 204A, which produces a heterojunction structure wherein a vertical two-dimensional hole gas 2DHG 206A is formed within the channel layer 203A adjacent to the vertical interface 242.

Different from the embodiment shown in FIGS. 1A and 1B, a nucleation layer 202A is positioned within the groove 223 between the channel layer 203A and the barrier layer 204A. The direction of crystal growth of the channel layer 203A and the barrier layer 204A can be seen from the nucleation layer 202A, and thereby it can be determined that it is 2DHG therebetween. In some embodiments, it can determine whether it is 2DEG or 2DHG between the channel layer and the barrier layer according to the crystal growth direction although there is no nucleation layer 202A.

In some embodiments, a first groove is formed by etching the substrate and the channel layer 203A is formed within the first groove. Then, a second groove is formed by etching the substrate on the right of the first groove and the right side of the channel layer 203A is exposed. The barrier layer 204A is formed within the second groove. The vertical interface 242 is included between the channel layer 203A and the barrier layer 204A, and thereby forming a heterojunction. Both of the first groove and the second groove are parts of the groove 223.

In some embodiments, on the sidewall of the groove 223, a separating layer 212A is included between the substrate 201 and the channel layer 203A. On the bottom of the groove 223, a separating layer 215A is included between the substrate 101 and the channel layer 103A; and on the bottom of the groove 223, a separating layer 213A is included between the substrate 101 and the barrier layer 204A.

In some embodiments, the HHMT 200 comprises a first electrode 207, a second electrode 208, and a third electrode 209. The first electrode 207 and the second electrode 208 are the source and drain of the HHMT. Both are within the scope of the groove 223 and on the channel layer 203A and/or the barrier layer 204A. The third electrode is the gate and is positioned outside of the barrier layer 204A. It extends downwardly entering into the groove 223. The third electrode 209 is generally not lower than the 2DHG 206A to effectively control the current intensity between the first electrode 207 and the second electrode 208. As shown in FIG. 2A, the electrodes 207 and 208 are formed on the same side of the nucleation layer 202A. Because the nucleation layer 202A has certain height and width, it makes 2DHG 206A nearby disappeared and 2DHG 206A on the top diminished and further makes the current intensity between the electrodes 207 and 208 weakened. In some embodiments, the electrodes 207 and 208 are formed on two sides of the nucleation layer 202A, which may improve the withstanding voltage of the device for the grooves having the same lengths.

In some embodiments, the electrodes 207 and 208 are positioned on the top of the channel layer 203A and/or the barrier layer 204A, which may save the manufacturing working time and cost. In some embodiments, the electrodes 207 and 208 may extend downwardly entering into the groove 223, like the third electrode 209. This may increase the contact area between the electrodes 207 and 208 and the 2DHG 206A and improve conductive capacity. Similar structures may also be applied in other semiconductor devices and are also within protection scope of this application.

In some embodiments, the HHMT 200 further comprises a screening layer 216. The screening layer 216 may occupy the right of the barrier layer 204A. It extends downwardly and covers the sidewall the barrier layer 204A within the groove 223, which provides protection of the internal channel layer 203A and the barrier layer 204A. In some embodiments, the gate electrode 209 is formed within the screening layer 216 and is enveloped in the screening layer 216. Thus, the screening layer 216 can be regarded as a gate insulating layer. In some embodiments, the material of the screening layer 216 may be insulating materials such as SiN, $SiO_2$, etc. The screening layer 216 is helpful to reduce drain current collapse and maintain 2DEG or 2DHG produced by polarity properties. Meanwhile, the screening layer 216 can also reduce a leak current of the gate, avoid cracking during the temperature decrease after growth of the barrier layer 204 and increase ohmic contacts of the source and drain and breakdown voltage.

In some embodiments, the HHMT 200 further comprises a blocking layer 211, which is formed as the sidewall of the groove 223 or a part of the same. It embraces one or both of the first electrode 207 and the second electrode 208. The blocking layer 211 makes the first electrode 207 and the second electrode 208 separated from the substrate 201 and facilitate improvement of withstanding voltage of the HHMT 200.

Based on the above, the present disclosure provides a structure which has two-side 2DEG or 2DHG and has bigger contact area and higher power.

Figure 3A:
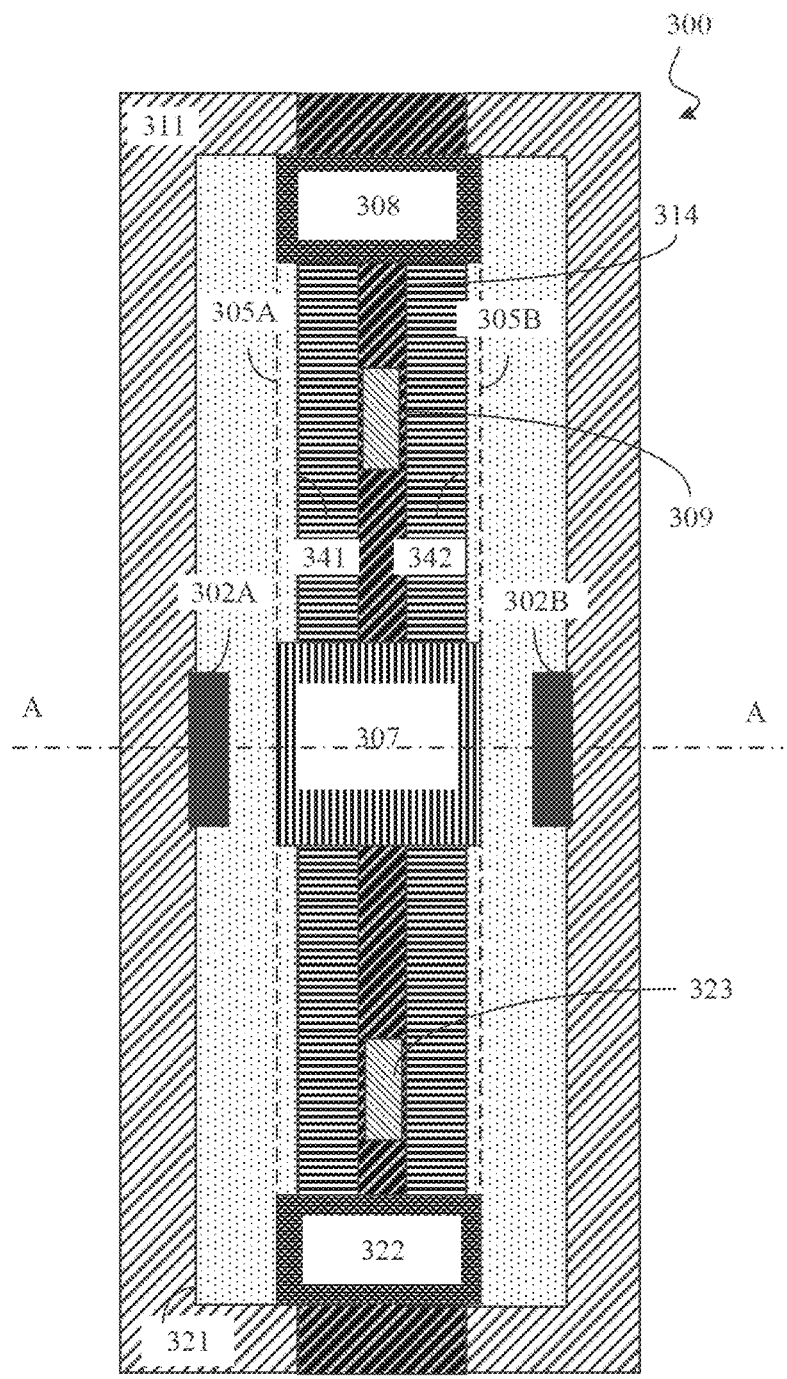
FIG. 3A is a top view of a dual-channel HEMT according to an embodiment of the present disclosure.
Figure 3B:
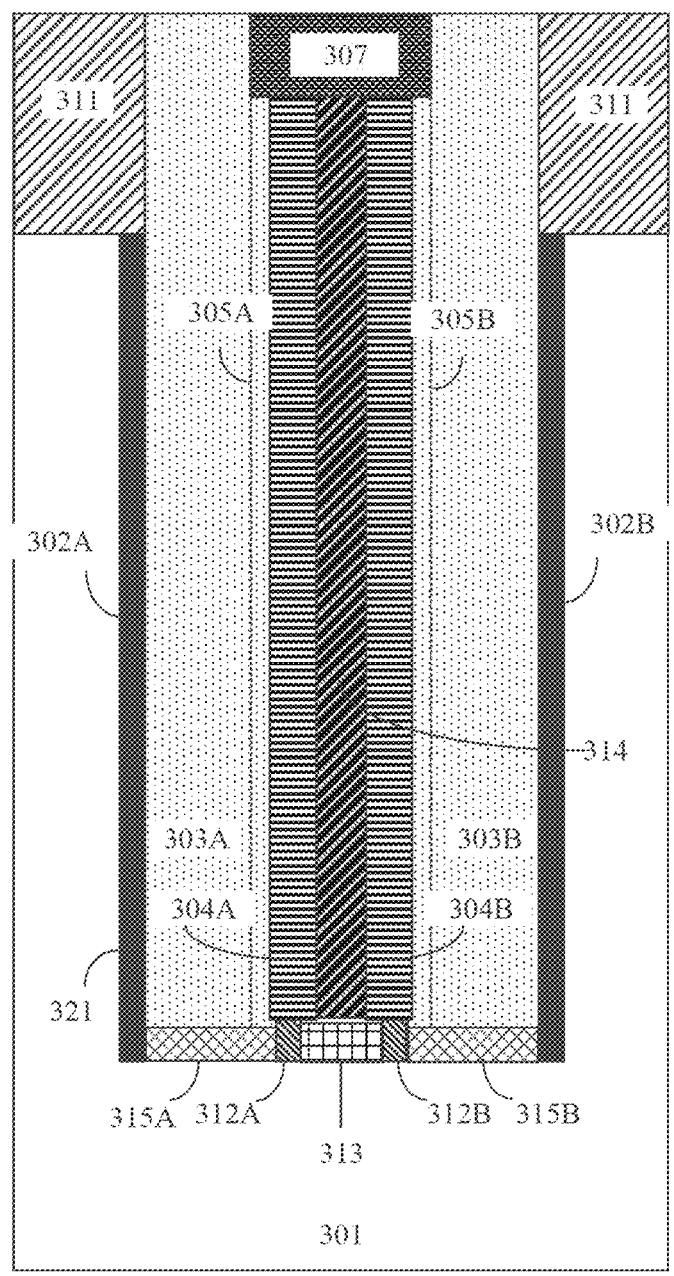
FIG. 3B is a sectional view of a dual-channel HEMT according to an embodiment of the present disclosure.

FIG. 3A is a top view of a dual-channel HEMT according to an embodiment of the present disclosure; and FIG. 3B is a sectional view of a dual-channel HEMT according to an embodiment of the present disclosure. The HEMT 300 shown in FIG. 3A may be considered a combination of two semiconductor device 100 shown as FIGS. 1A and 1B. The parts thereof similar to the above structure are not repeated therein.

As shown in the figures, the HEMT 300 is within the groove 321 and comprises channel layers 303A and 303B and barrier layers 304A and 304B. Further, two vertical interfaces 341 and 342 are formed and thereby two heterojunctions are respectively formed. In the channel layer 303A and 303B adjacent to the barrier layers 304A and 304B, the 2DEGs 305A and 305B are formed. On the top of the channel layer 303A and 303B and/or the barrier layers 304A and 304B, a first electrode 307 and a second electrode 308 electrically connected to both of the 2DEG 305A and 305B are formed. The third electrode (gate electrode) 309 is formed between the barrier layers 304A and 304B, wherein the gate electrode 309 is configured to control the current intensity between the first electrode 307 and the second electrode 308. In some embodiments, the nucleation layers 302A and 302B are included in the groove 321.

As shown in FIG. 3A, the HEMT 300 includes two conductive channels, i.e. 2DEG 305A and 305B. The advantage of this arrangement is that the increased conductive channel may magnify conductive current and have higher power. Furthermore, in comparison with the single conductive channel, the dual conductive channels have better performance of voltage withstanding and heat resistance. Further, the electrodes having the same properties in the dual conductive channels may be share and it is not necessary to respectively form the two electrodes. This arrangement can save room and significantly save manufacturing working time and cost.

In some embodiments, this structure further comprises a screening layer 314 positioned between the barrier layers 304A and 304B. The screening layer 314 extends vertically into the groove 321 and its material may be insulating materials such as $SiO_2$, etc. The screening layer 314 makes the devices on the two sides separated, especially improves insulation between the 2DEG 305A and 305B. It further makes capacities of enhancing the withstanding voltage and reducing the dark current significantly improved. In addition, existence of the screening layer 314 facilitates forming of the electrodes on the top. Because of insulation of the screening layer 314, the gate electrode may be formed in the screening layer 314, which makes the screening layer 314 as the gate insulating layer. In addition, the screening layer 314 can also avoid cracking during the temperature decrease after growth of the barrier layers 304A and 304B and increase ohmic contacts of the source and drain and breakdown voltage.

In some embodiments, within the groove 321, first separating layers 315A and 315B are included between the channel layers 303A and 303B and the substrate 301 and extend horizontally. second separating layers 312A and 312B are included between the barrier layers 304A and 304B and the substrate 301 and extend horizontally. A spacing layer 313 is included between the screening layer 314 and the substrate 301 and also extends horizontally.

In some embodiments, as shown in FIG. 3A, it further comprises a fourth electrode 322 positioned on the channel layers 303A and 303B and/or the barrier layers 304A and 304B and electrically connected to 2DEG 305A and 305B together and a fifth electrode 323 positioned between the first electrode 307 and the fourth electrode 322 and controlling the current intensity between the first electrode 307 and the fourth electrode 322. That is, another HEMT structure is formed in the same manner on one side of the HEMT 300.

The two HEMT structures are within the same groove 321 and both may share the nucleation layer 302A and 302B and the first electrode 307. In some embodiments, a plurality of HEMT structures may be included in the same groove 321. The advantage is that it may save manufacturing cost and working time. Further, because of the distance between the devices become smaller, it allows higher integrity and improvement of usage of the substrate.

As the embodiment shown in FIGS. 3A and 3B, the present disclosure may comprise dual-channel HHMT. Or, in condition that there are only two electrodes in the above structure which are respectively in ohmic and Schottky contacts with the 2DEG and/or 2DHG, a dual-channel Schottky diode may be formed. Those similar structures and functions are not described in details herein.

Figure 3C:
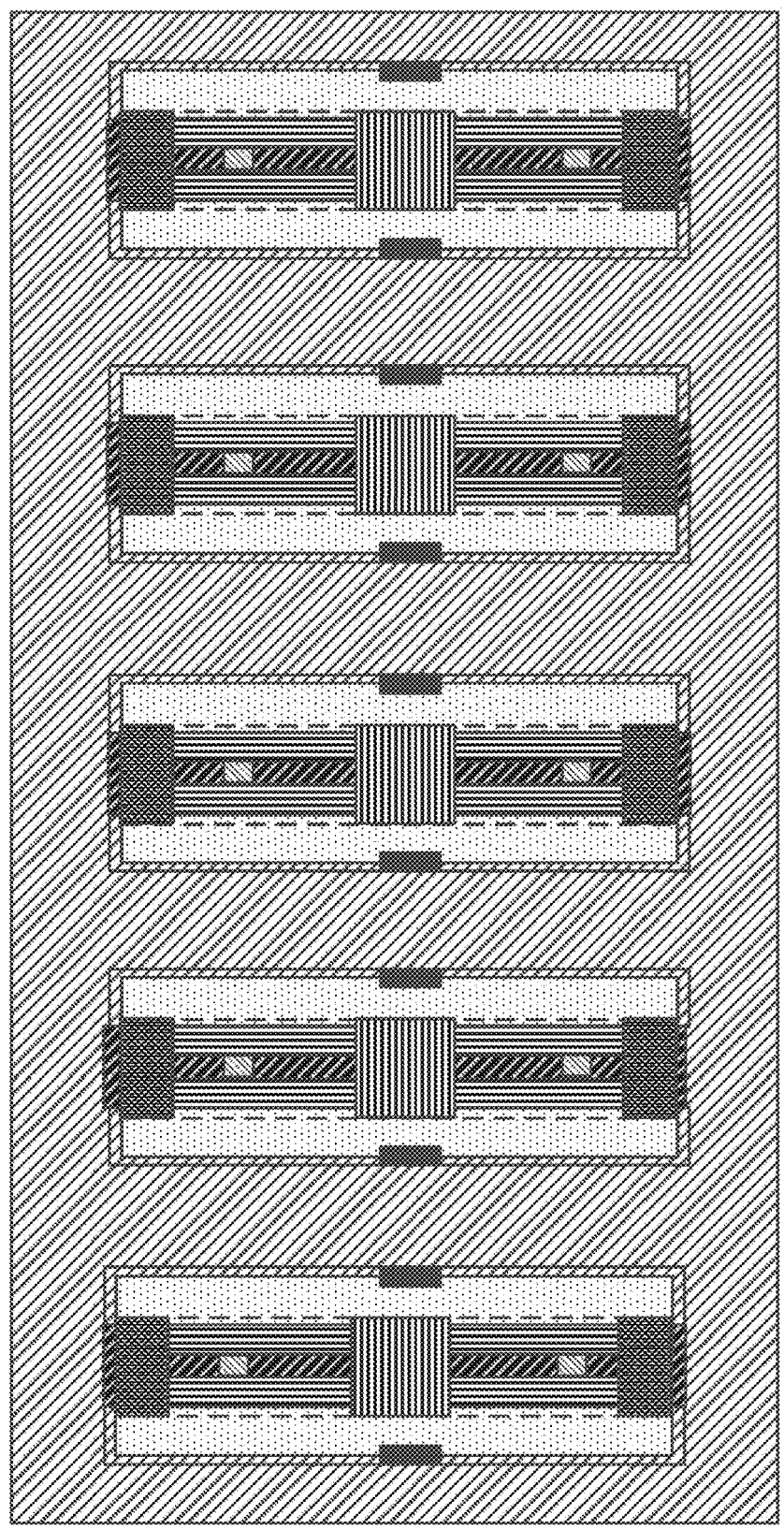
FIG. 3C is a top view of arrangement of multiple dual-channel HEMTs according to an embodiment of the present disclosure.

FIG. 3C is a top view of arrangement of multiple dual-channel HEMTs according to an embodiment of the present disclosure. When a plurality of structures as shown in FIGS. 3A and 3B are formed on the substrate, the arrangement of respective devices are shown as FIG. 3C.

Figure 4A:
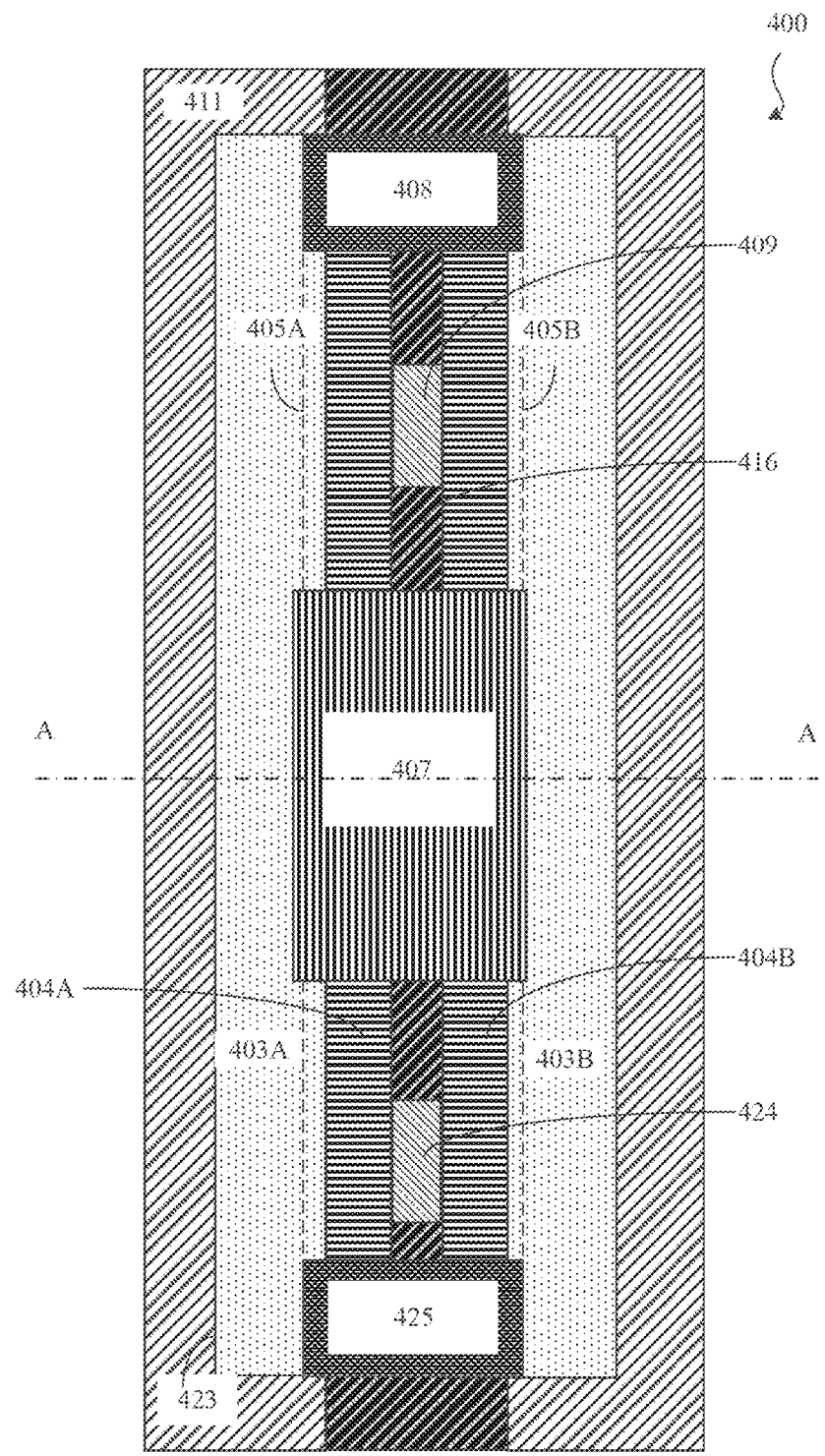
FIG. 4A is a top view of a dual-channel HHMT according to an embodiment of the present disclosure.
Figure 4B:
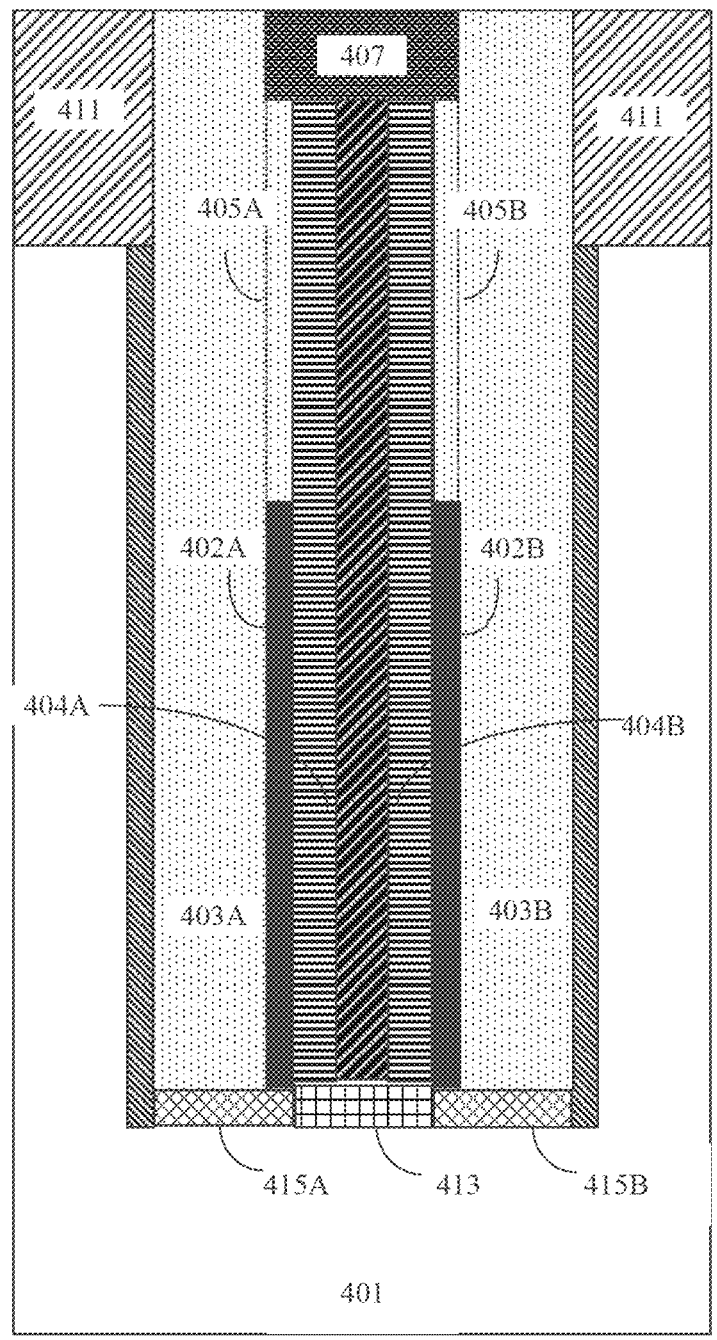
FIG. 4B is a sectional view of a dual-channel HHMT according to an embodiment of the present disclosure.

FIGS. 4A and 4B are schematic diagrams of a dual-channel HHMT according to an embodiment of the present disclosure, wherein the structures as same as or similar to those in FIGS. 1A and 1B are not repeated. In the embodiment of FIGS. 4A and 4B, barrier layers 404A and 404B are respectively formed on the same sides of nucleation layers 402A and 402B outside of channel layers. The 2DHG 404A and 404B are formed in the channel layers adjacent to the barrier layers. Then, a first electrode and a second electrode connected to the 2DHG 404A and 404B are formed and thereby the HHMT is formed. The positions of the nucleation layers 402A and 402B in FIG. 4B are different from those in FIG. 3B. The former ones are positioned in the groove between the barrier layers and the channel layers, and the latter ones are positioned between the sidewalls of the groove and the channel layers away from the barriers. The position difference of the nucleation layers represents difference directions of crystal growths and also represents it is 2DEG or 2DHG formed therebetween. As understood by persons having ordinary skills in the art, the nucleation layer is not necessary in some embodiments of the present disclosure. However, whether it is 2DEG or 2DHG can also be determined according to the direction of crystal growth. In some embodiments, the electrode 407 is longer than the nucleation layers 402A and 402B, which can ensure adequate contact between the electrode 407 and the 2DHG.

Figure 4C:
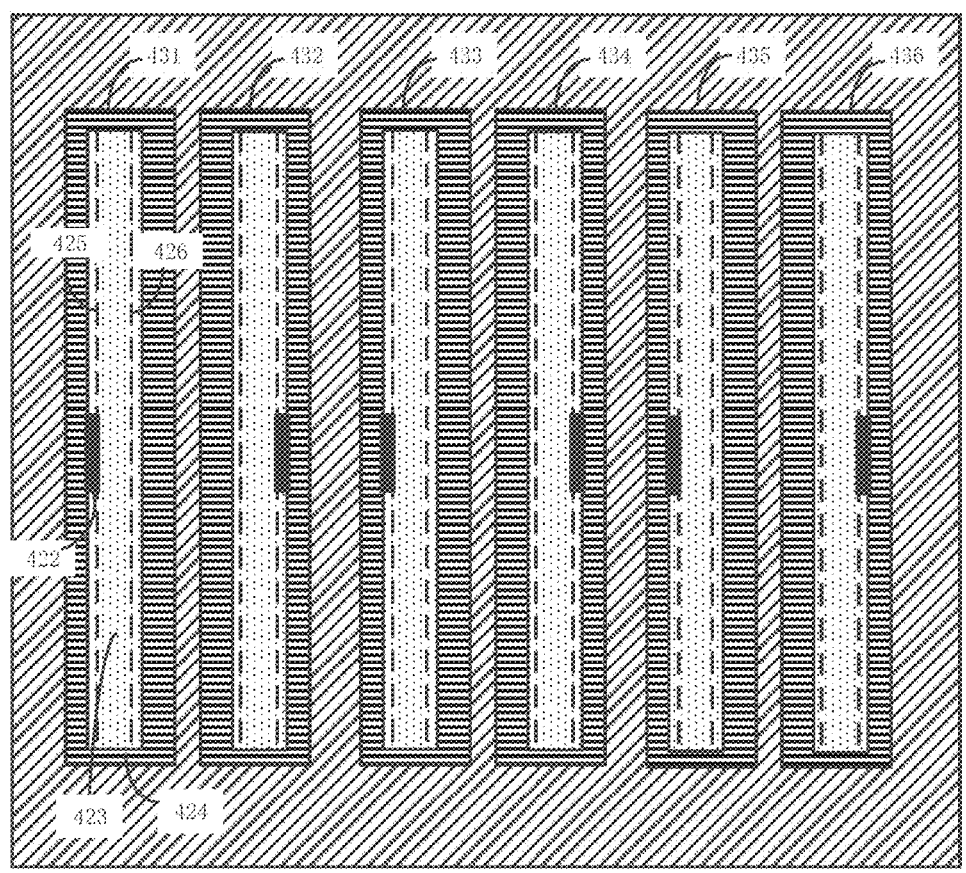
FIG. 4C is a schematic diagram of a semiconductor device having both 2DEG and 2DHG according to an embodiment of the present disclosure.

In some embodiments, the semiconductor device of the present disclosure may include both 2DEG and 2DHG, wherein the 2DEG and 2DHG may be together formed in the same semiconductor device or independently formed in the semiconductor devices having respective functions. FIG. 4C is a schematic diagram of a semiconductor device having both 2DEG and 2DHG according to an embodiment of the present disclosure. As shown in FIG. 4C, a plurality of grooves 431-436 are formed in the substrate. Taking the semiconductor device in the groove 431 as an example, within the groove 431, 2DEG 425 and 2DHG 426 are respectively formed on the two vertical interfaces adjacent to the barrier layer 424. FIG. 4C only presents a part of structures of the channel layers 423 and the barrier layer 424. Other structures in the above may also be applied in the embodiment of the FIG. 4C.

The present disclosure also provides a manufacturing method of the semiconductor device. The manufacturing method of the semiconductor device of the present disclosure is described below by those of manufacturing a dual-channel HEMT as an example.

FIGS. 5AA-5SB are flowchart diagrams of a method of manufacturing a dual-channel HEMT according to an embodiment of the present disclosure; wherein FIGS. 5AA-5SA are top views of the method of manufacturing a dual-channel HEMT according to an embodiment of the present disclosure and FIGS. 5AB-5SB are sectional views of the method of manufacturing a dual-channel HEMT according to an embodiment of the present disclosure. In this embodiment, the Si substrate is used as an example for manufacturing the device. As understood by persons skilled in the art, other substrates such as intrinsic GaN, $Al_2O_3$ (sapphire), SiC and so on may also be used to realize similar structures.

As shown in the figures, the manufacturing method 500 of the HEMT comprises: at the step 5001, providing the Si substrate 501 as shown in FIGS. 5AA and 5AB.

Figure 5B:
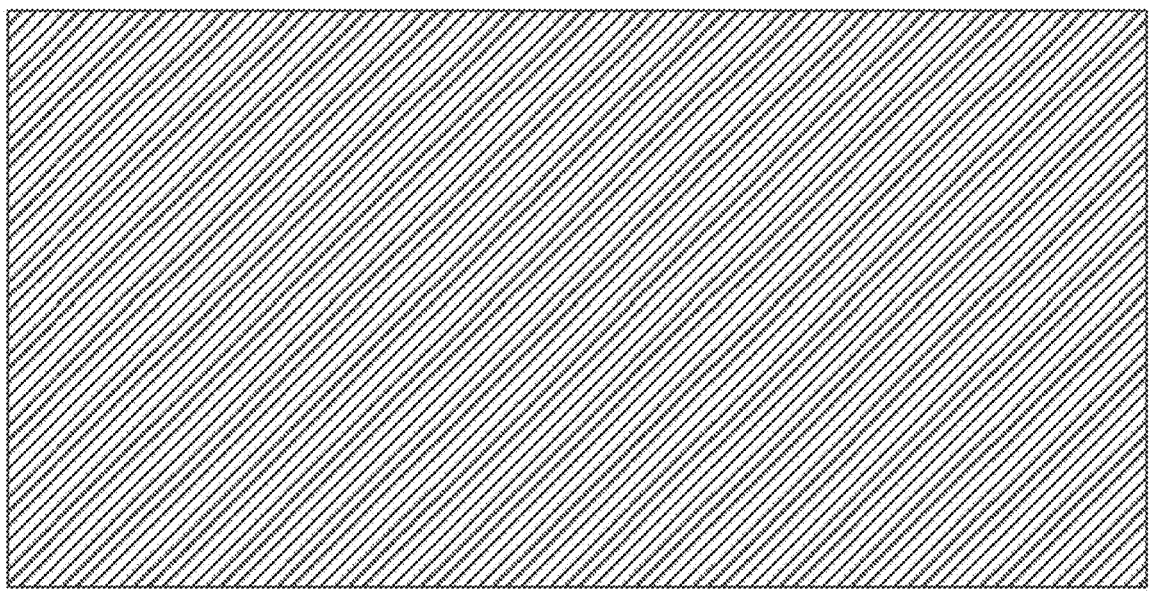
FIGS. 5AA-5SB are flowchart diagrams of a method of manufacturing a dual-channel HHMT according to an embodiment of the present disclosure.
Figure 5B:

At the step 5002, a blocking layer 511 is formed on the substrate 501 as shown in FIGS. 5BA and 5BB. The blocking layer 511 is formed on the substrate 501 by growth of $SiO_2$ with oxidation technology and it covers the whole substrate 501. There are other methods to obtain the substrate covered by silicon oxide in the art. Those methods can also be applied herein.

Figure 5C:
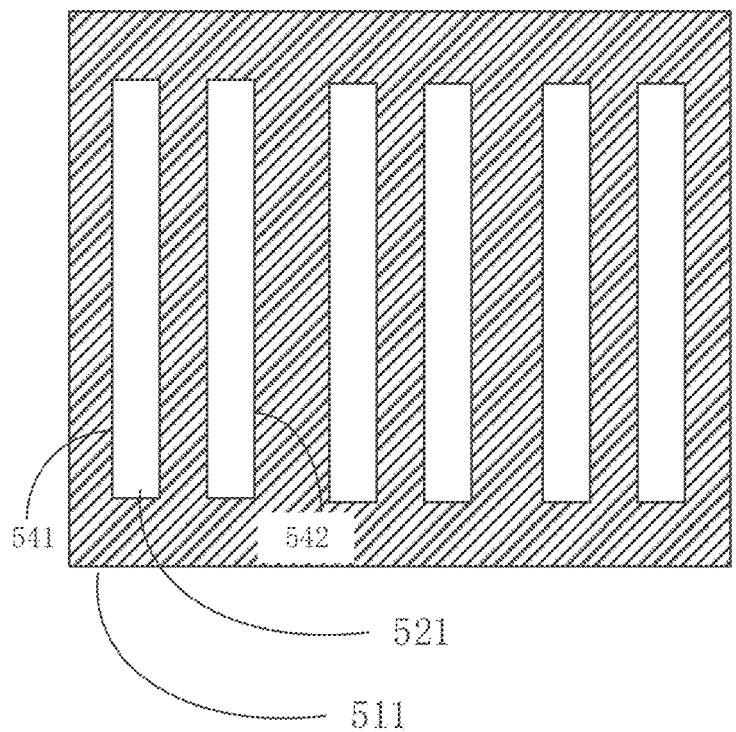
Figure 5C:
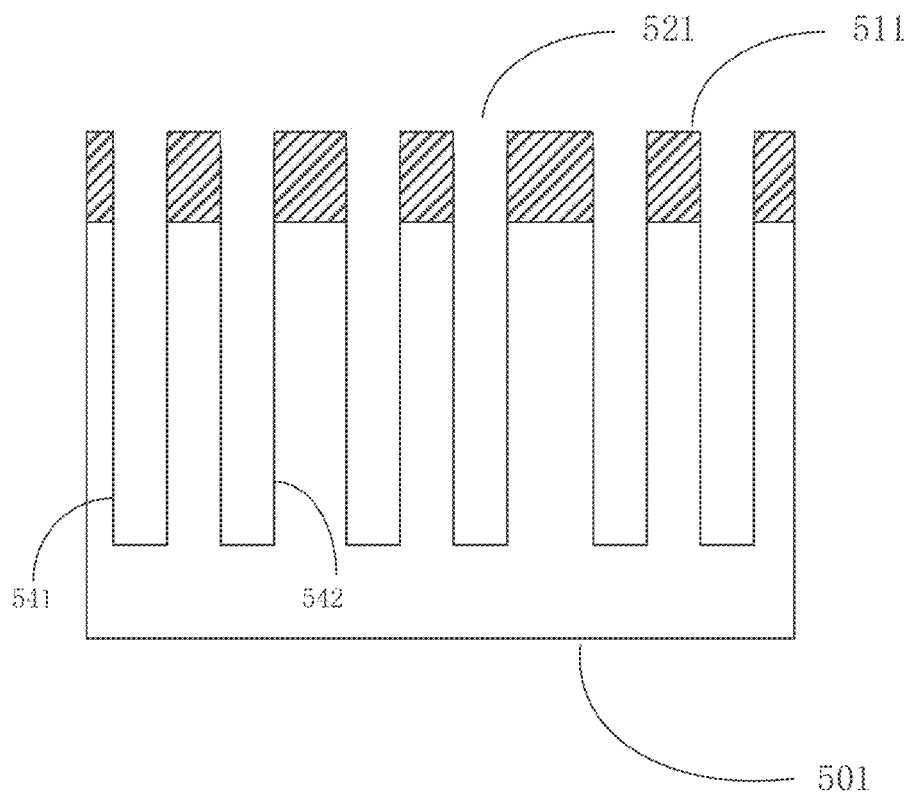

At the step 5003, a plurality of first grooves are formed on the substrate as shown in FIGS. 5CA and 5CB. The blocking layer 511 and the substrate thereunder are etched to form a plurality of grooves 521 having vertical surfaces and arranged horizontally, wherein the vertical surfaces 541 and 542 of the substrate within the groove 521 are (111) planes of the Si substrate.

In some embodiments, the number of the grooves set on the same substrate may be decided according to requirements of integrity and voltage withstanding. It is described herein with the example of 6 grooves. The shapes and sizes of the grooves may be pre-configured according to the practical requirements in the method related to the present disclosure. For example, when manufacturing of a semiconductor device with relatively big ratio of height to width, the depths of the grooves may be also big.

Figure 5D:
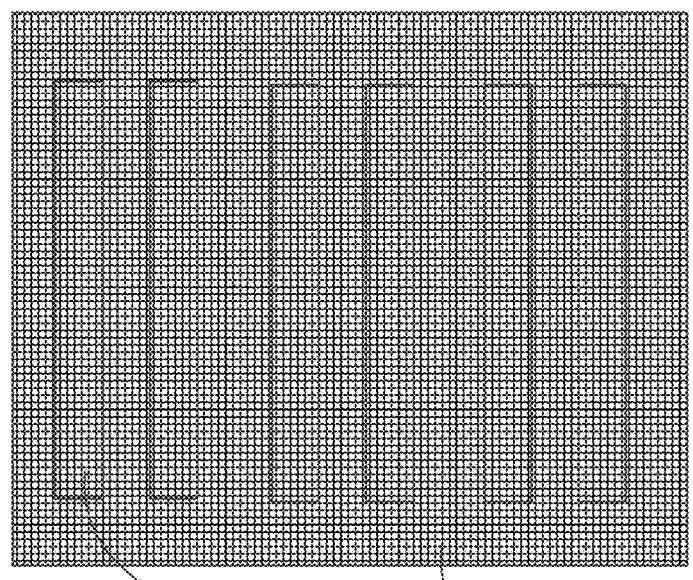
Figure 5D:
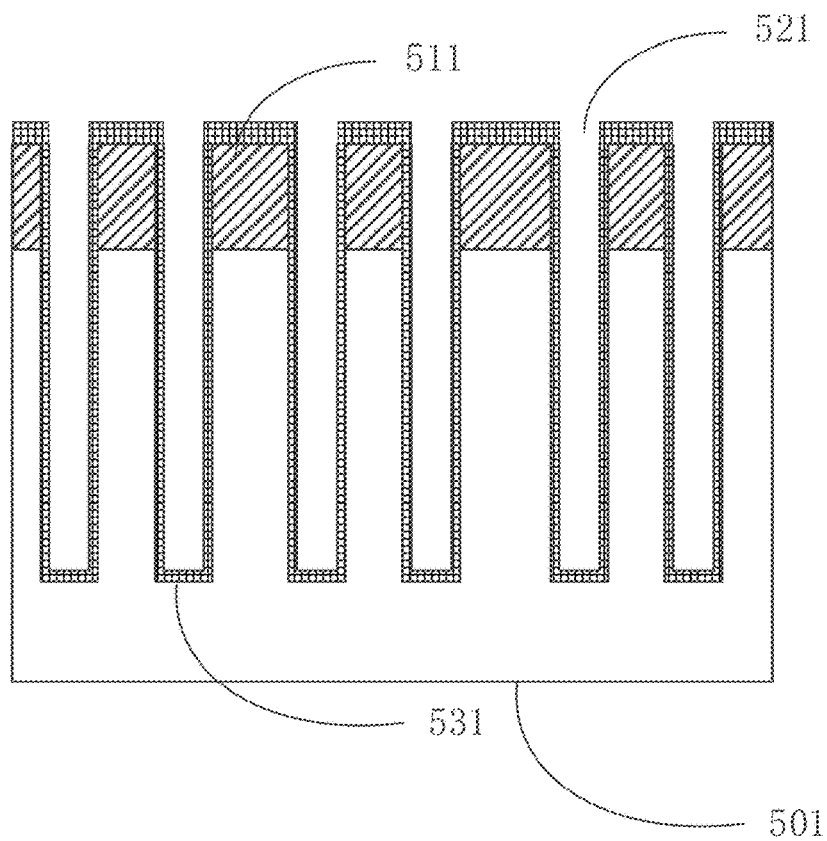

At the step 5004, a protection layer is formed on the surfaces of the grooves and the substrate as shown in FIGS. 5DA and 5DB. In some embodiments, a SiN protection layer 531 is formed on the substrate 501 with LPCVD technology and the like. The surfaces of the substrate 501 and the grooves 521 are covered.

Figure 5E:
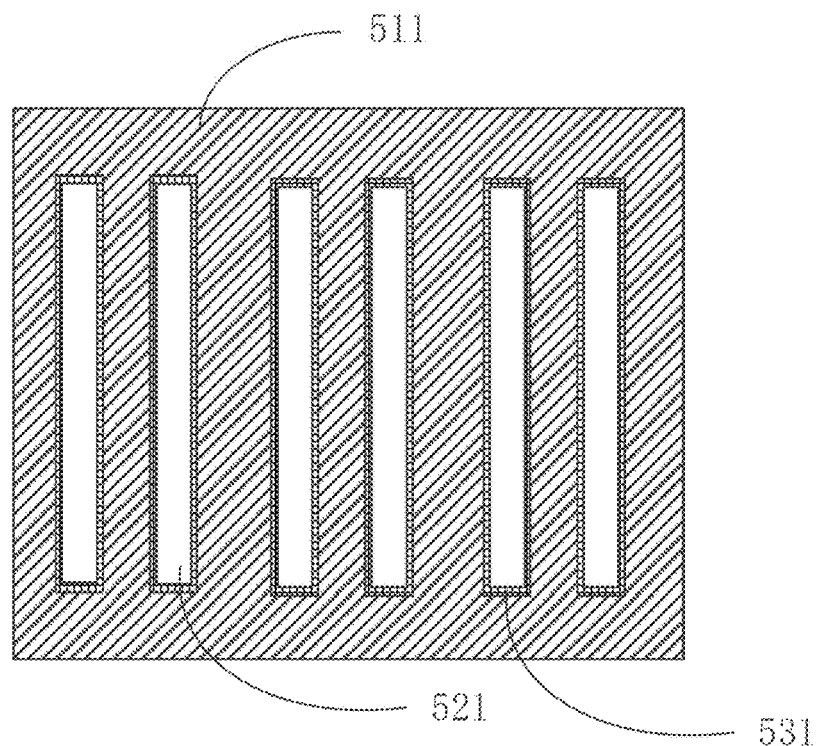
Figure 5E:
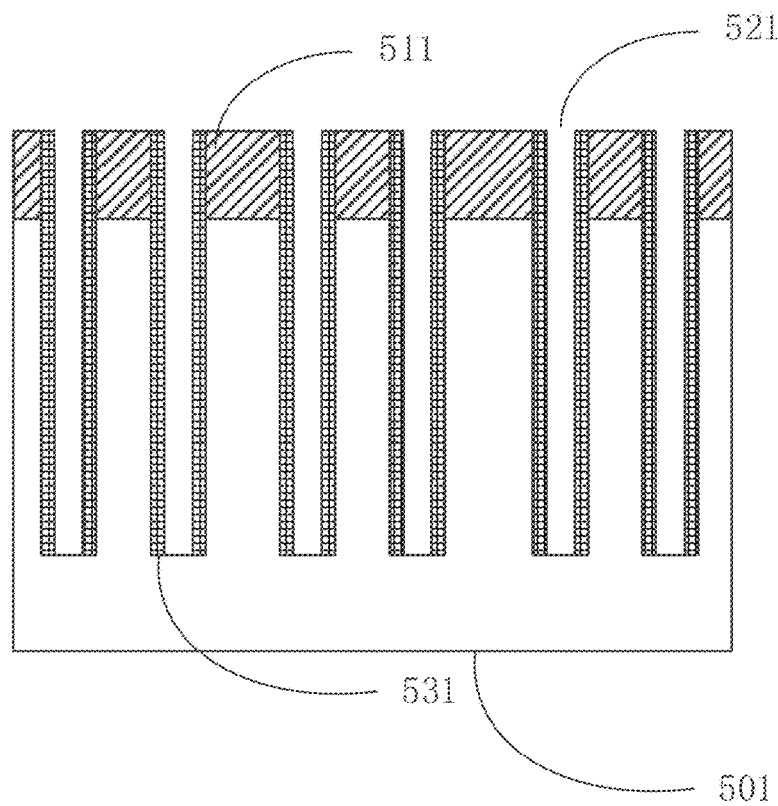

At the step 5005, a protection layer on the bottom of the grooves are patterned as shown in FIGS. 5EA and 5EB. Only the protection layer formed by SiN on the vertical surfaces 541 and 542 are retained and the Si substrates 501 on the bottoms of the grooves 521 are exposed. The protection layers still cover the vertical surfaces 541 and 542 of the substrate of the substrate grooves 521.

Figure 5F:
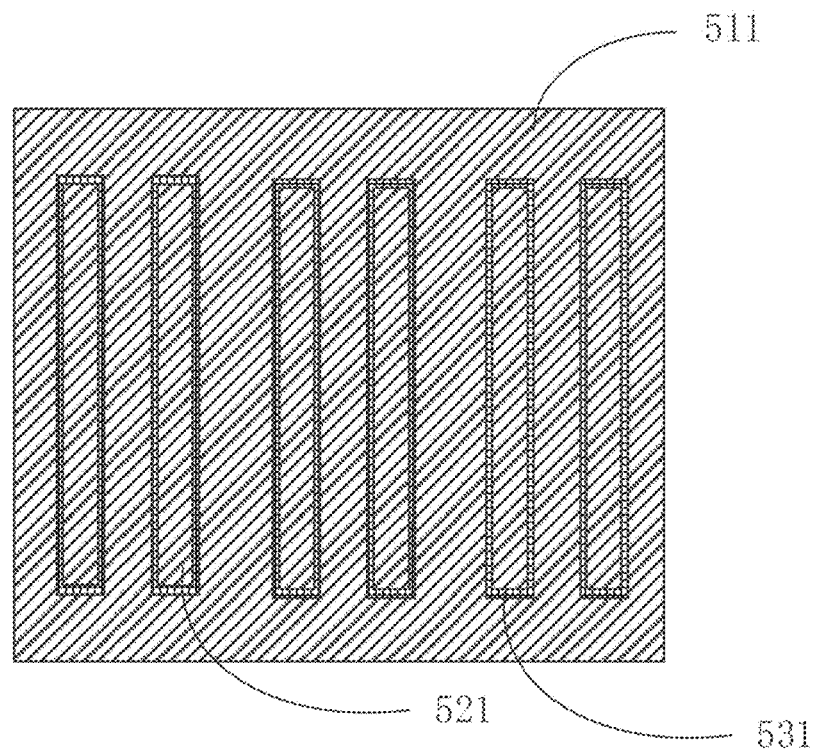
Figure 5F:
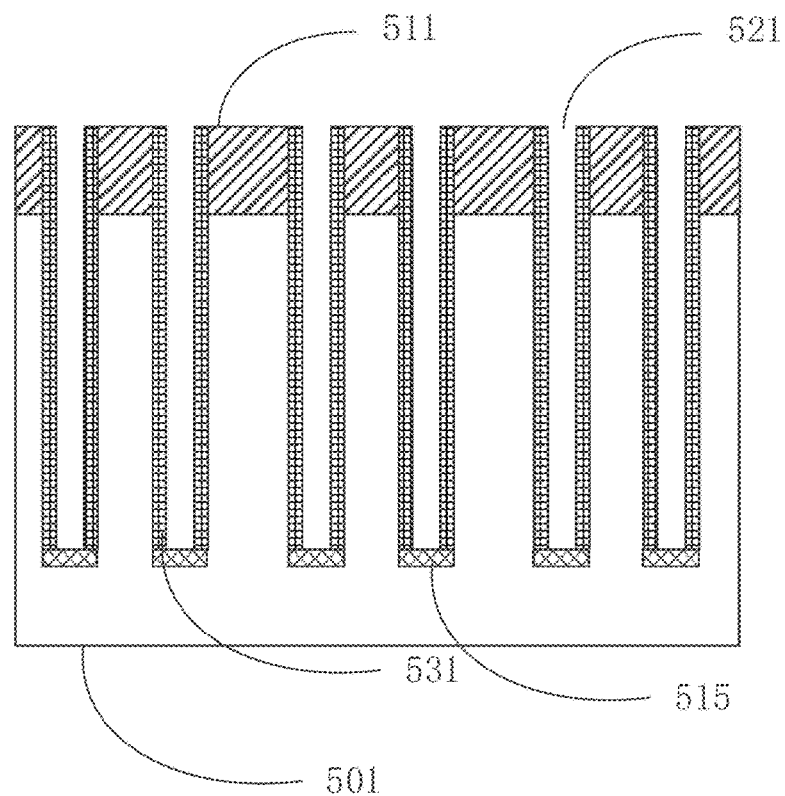

At the step 5006, first separating layers are formed within the grooves as shown in FIGS. 5FA and 5FB. The separating layers 515 cover the bottoms of the grooves 521. In some embodiments, the first separating layers are formed on the substrate 501 by growth of $SiO_2$ with oxidation technology. Because of protection layers 531 covering the vertical surfaces 541 and 542 of the substrate 501, there is almost no separating layers 515 grown on the vertical surfaces 541 and 542 of the substrate 501.

Figure 5G:
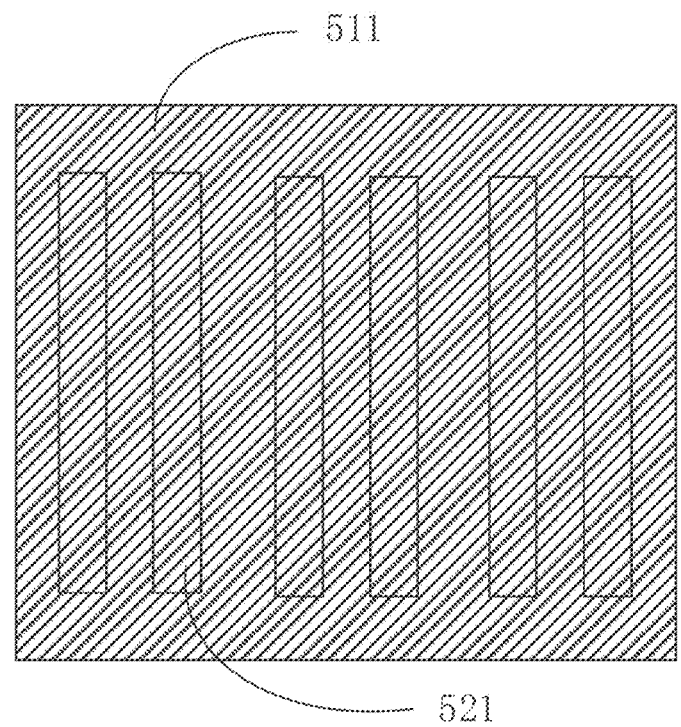
Figure 5G:
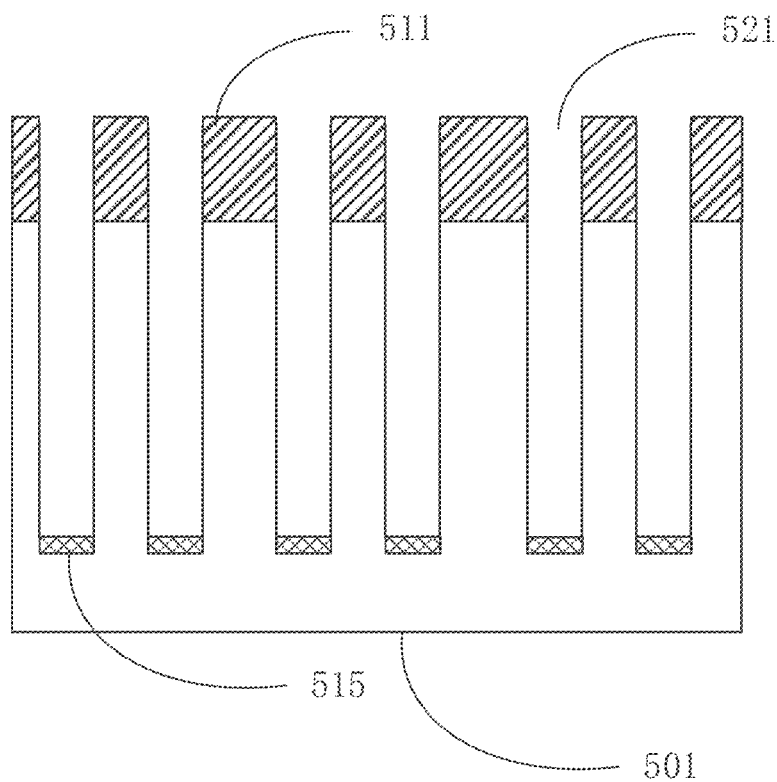

At the step 5007, the protection layers on the sidewall of the grooves are removed as shown in FIGS. 5GA and 5GB. A mask is covered on the top of the blocking layer 511 above the substrate 501 and then the protection layers 531 on the sidewall of the grooves 521 are etched by the photoetching technology. After etching, the vertical surfaces 541 and 542 of the substrate 501 are exposed. There are other methods to remove the protection layer and expose the vertical surface of the substrate in the art. Those methods can also be applied herein.

Figure 5H:
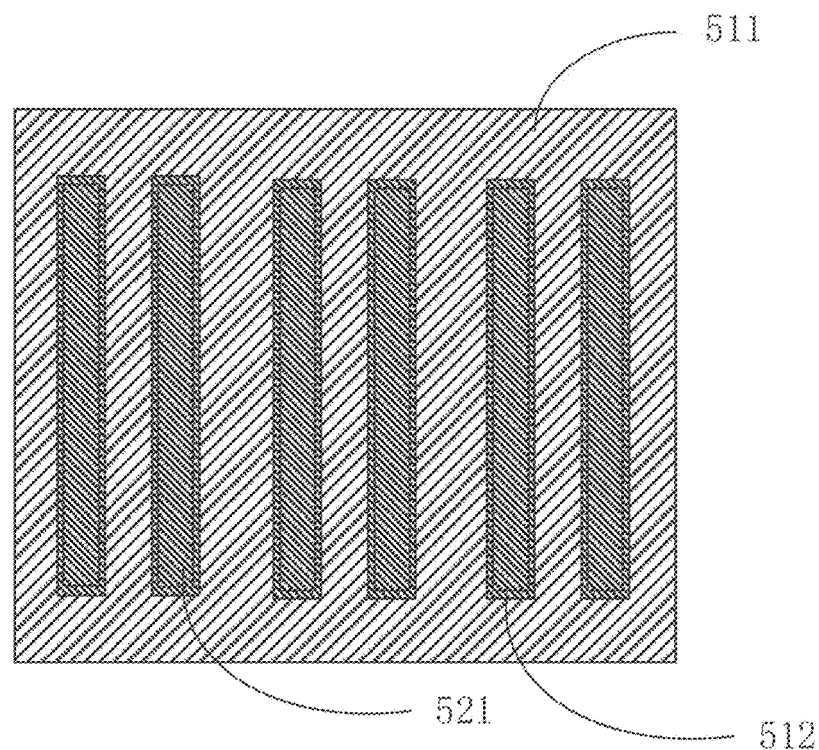
Figure 5H:
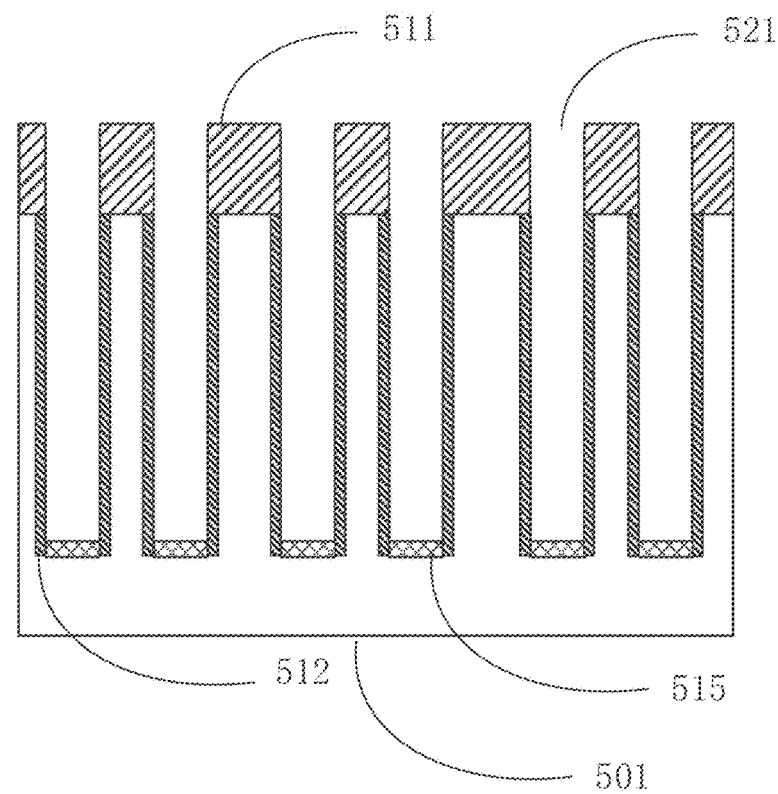

At the step 5008, spacing layers are formed on the sidewalls of the grooves as shown in FIGS. 5HA and 5HB. In some embodiments, the spacing layers 512 of $SiO_2$ are formed on the sidewalls of the grooves 521 by the oxidation technology. In some embodiments, the first separating layers 515 is thicker than the spacing layer 512.

Figure 5I:
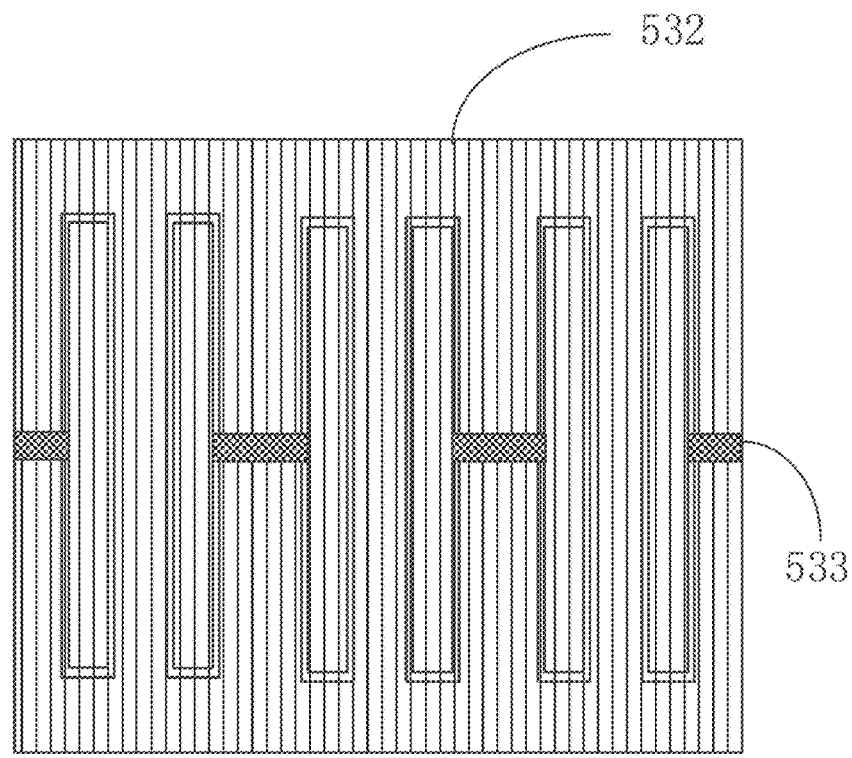
Figure 5I:
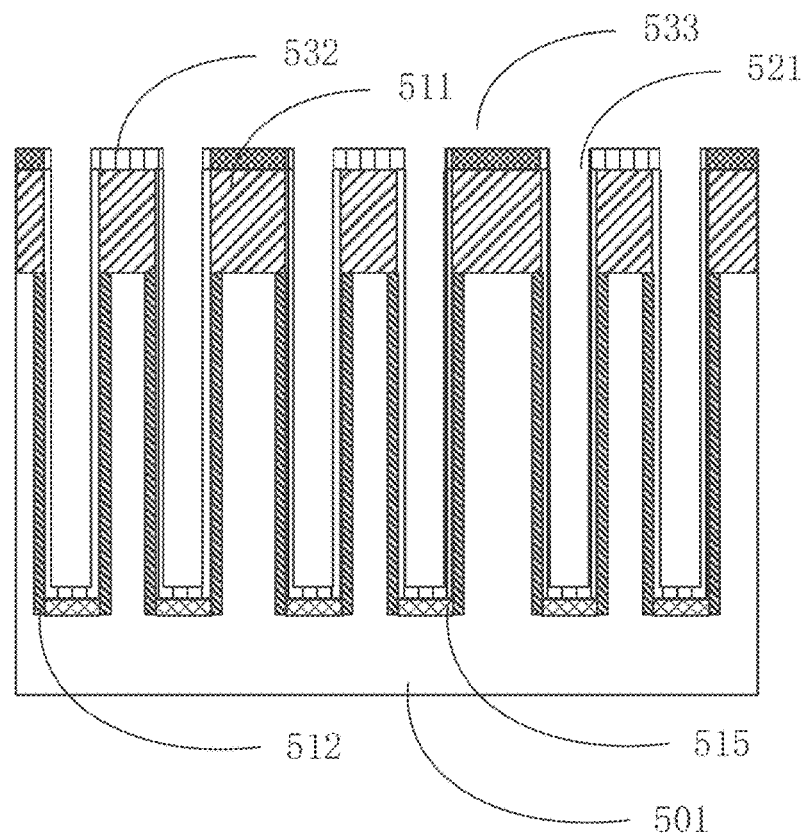

At the step 5009, a mask is covered on the insulating layers as shown in FIGS. 5IA and 5IB. The mask 532 is applied to cover the blocking layer 511. The mask holes 533 are set on the mask 532. The mask holes 533 make the parts of the spacing layers 512 on the sidewall of the grooves 521 exposed.

Figure 5J:
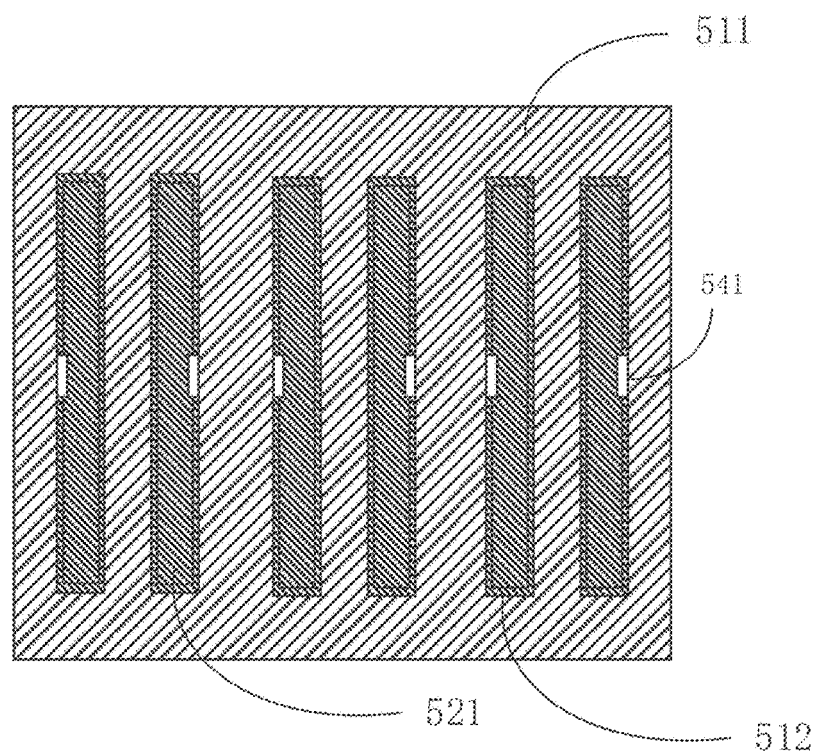
Figure 5J:
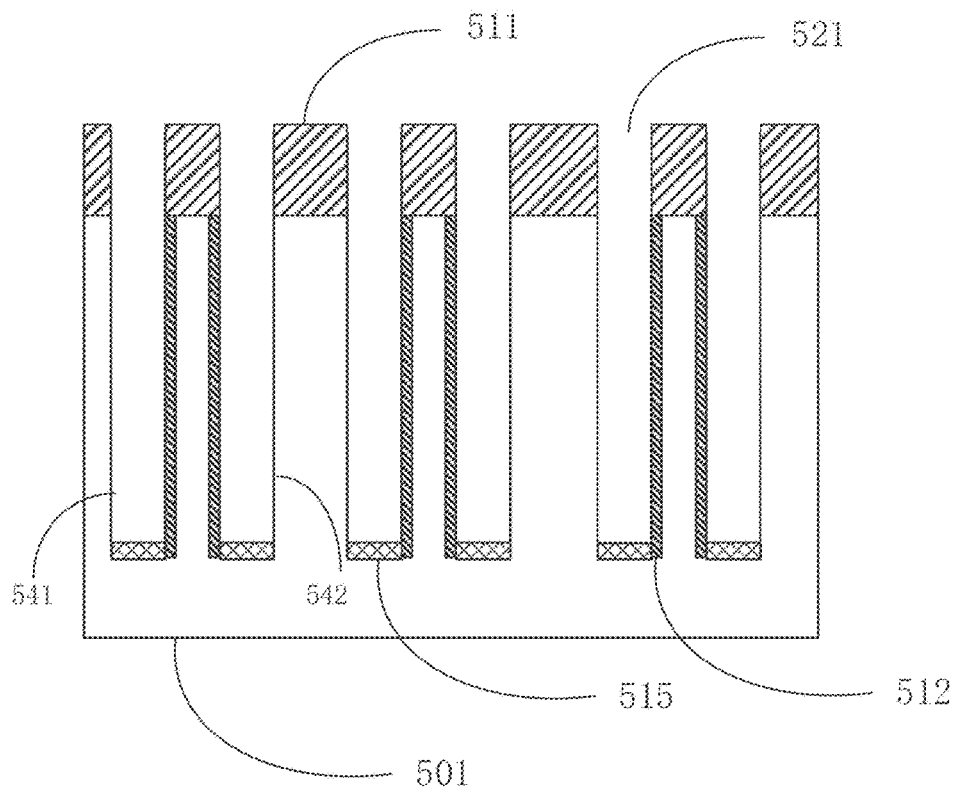

At the step 5010, parts of the protection layers on the sidewall of the grooves 521 are etched through the mask holes 533 and parts of the substrate vertical surfaces of the groove 521 are exposed, and then the mask is removed as shown in FIGS. 5JA and 5JB. In some embodiments, the separating layers 512 on the vertical surface 541 and 542 in the neighboring grooves are respectively etched by the photoetching, making the vertical surface 541 and 542 in the neighboring grooves exposed.

In some embodiments, the shapes and positions of the mask holes 533 may be changed according to practical requirements. In this embodiment, the vertical surfaces adjacent to each other in the neighboring grooves are selected to be exposed in order to generate the dual-channel HEMT.

It should be appreciated there are other technologies to form the blocking layers 511, the separating layers 512, and the separating layers 515 and make the vertical surfaces of the substrate exposed at the same time. For example, the grooves having specific shapes may be formed at first on the substrate. Then, the blocking layers 511, the separating layers 512, and the separating layers 515 are formed by oxidation. The parts of the blocking layers 511 are then covered by a mask. The separating layers 512 on the vertical surfaces of the substrate are etched by photoetching, which makes the vertical surfaces of the substrate exposed.

Figure 5K:
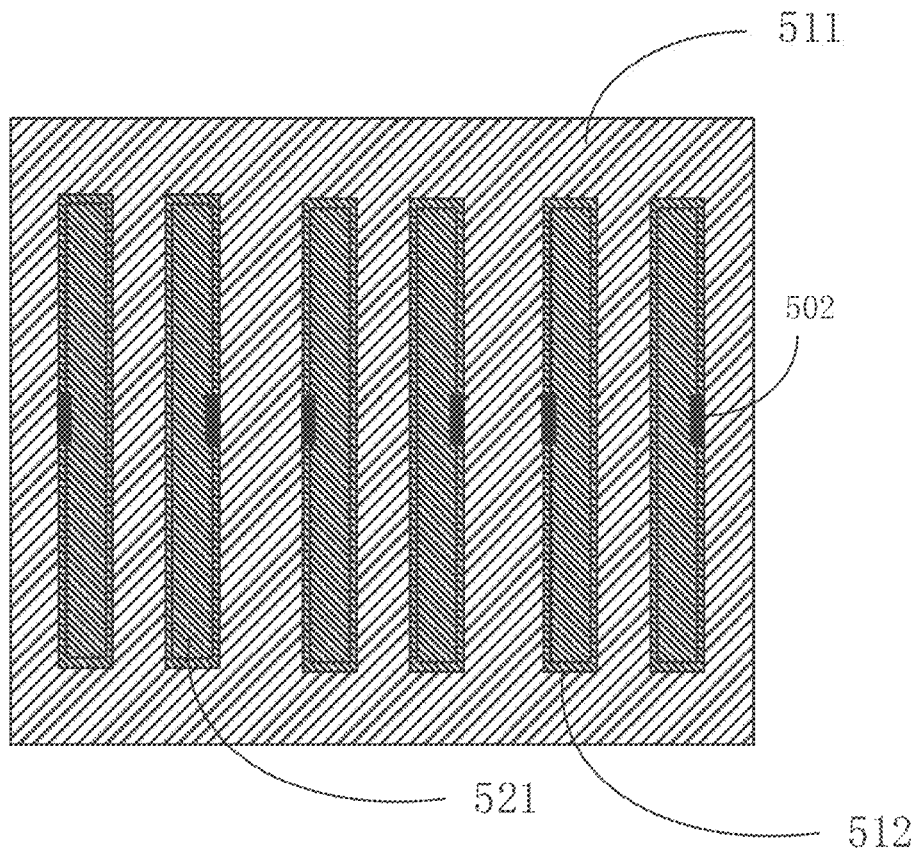
Figure 5K:
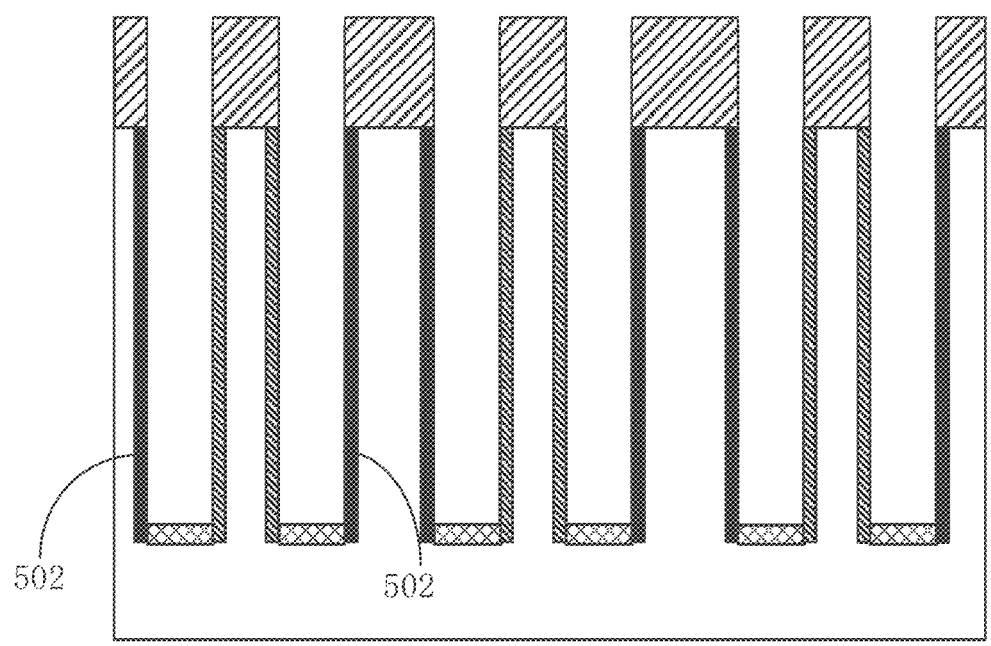

At the step 5011, the nucleation layers are formed on the vertical surfaces as shown in FIGS. 5KA and 5KB. The nucleation layers 502 are formed on the exposed vertical surfaces 541 and 542 of the substrate 501. For the Si substrate, the AlN is used in the nucleation layers 502 due to the melt-back effect of Ga atoms. As is known to persons skilled in the art, GaN can be directly nucleated at $Al_2O_3$ (sapphire), SiC or intrinsic GaN, but crystal quality control is difficult. Therefore, the nucleation layers 502 in general are introduced processes. In some cases, the nucleation layers 502 such as low temperature GaN or AlN in step 5011 may not be necessary to introduce.

The capacity of regional selective growth of AlN is weak. As a result, there may be some growth in the blocking layers 511, the separating layers 512 and the separating layers 515, which will have an adverse effect on the semiconductor devices. In some embodiments, the wafer can be taken out after AlN is grown. The AlN nucleation layer on the vertical surface can be retained by etching with anisotropy, while the AlN in other places can be removed, for example, by dry etching using vertical downward ion bombardment. Since the AlN on the vertical surfaces are less bombarded by ions and the AlN on other surfaces is more bombarded, only AlN on the vertical surface preserved can be achieved.

In some embodiments, the desire to remove AlN from the blocking layers 511, the separating layers 512 and the separating layers 515 may also lead to aeration of corrosive gases, such as chlorine or chlorinated gas, during the formation of the nucleation layer. Due to the amorphous or polycrystalline structure of the blocking layers 511, the separating layers 512 and the separating layers 515, AlN is more difficult to nucleate at the blocking layers 511, the separating layers 512 and the separating layers 515 in a chlorine atmosphere. In addition, even if AlN attachment appears in the blocking layers 511, the separating layers 512 and the separating layers 515, the AlN attached to the blocking layers 511, the separating layers 512 and the separating layers 515 are also amorphous or polycrystalline. The chlorine gas has a strong corrosive effect on them and the AlN attached will be etched away by chlorine gas. The AlN of the nucleation layer is a single crystal structure, which is weakly corroded by chlorine. The AlN of the nucleation layer can grow well under the chlorine atmosphere. Therefore, this method can also realize the selective growth of the nucleated layer.

In some embodiments, if the ratio of height to width is very big, the depth of the grooves 521 will also increase correspondingly, which might lead to the high nucleation layers 502. Because there are likely defects between the Si substrate and the GaN, it is better to form the nucleation layers 502 with small heights. For example, in the condition of FIGS. 5JA and 5JB, a sacrificial layer such as metal, polycrystalline silicon, or silicon nitride, etc., may be formed on the bottom of the grooves 521. Then, the protection layers such as silicon oxide are formed on the rest parts of the sidewalls of the grooves 521. Then, the sacrificial layers are removed by isotropic etching and the parts of the sidewalls of the grooves 521 which are originally covered by the sacrificial layers are exposed, i.e. the vertical surfaces of the substrate. Next, the nucleation layers 502 are formed on the vertical surfaces of the substrate. Accordingly, the nucleation layers 502 with small heights are obtained, which can ensure crystal quality, improve capability of voltage withstanding, and reduce influence caused by crystal defects.

Figure 5L:
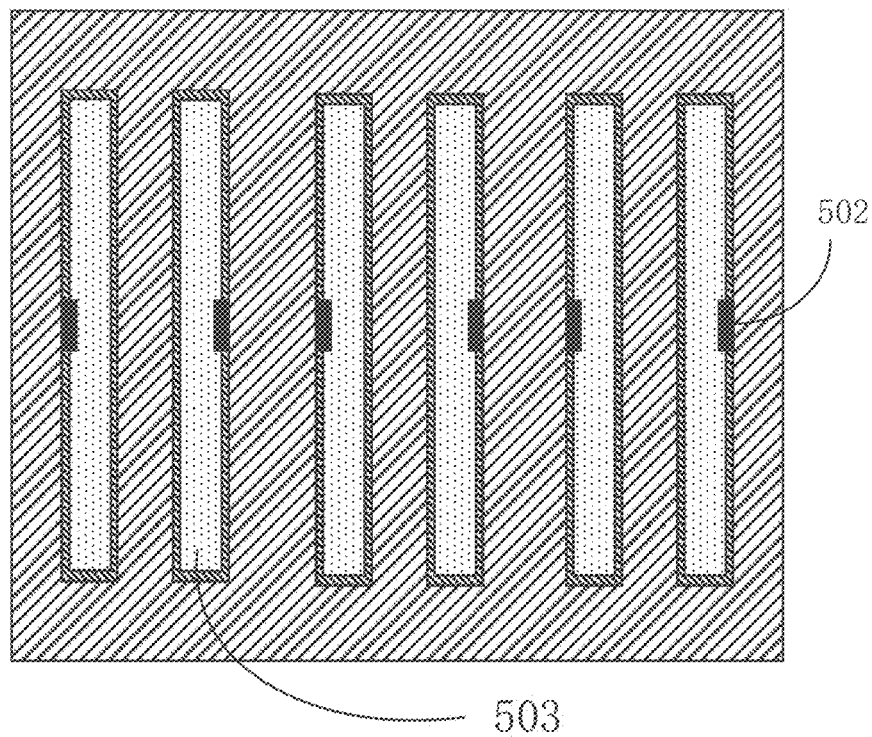
Figure 5L:
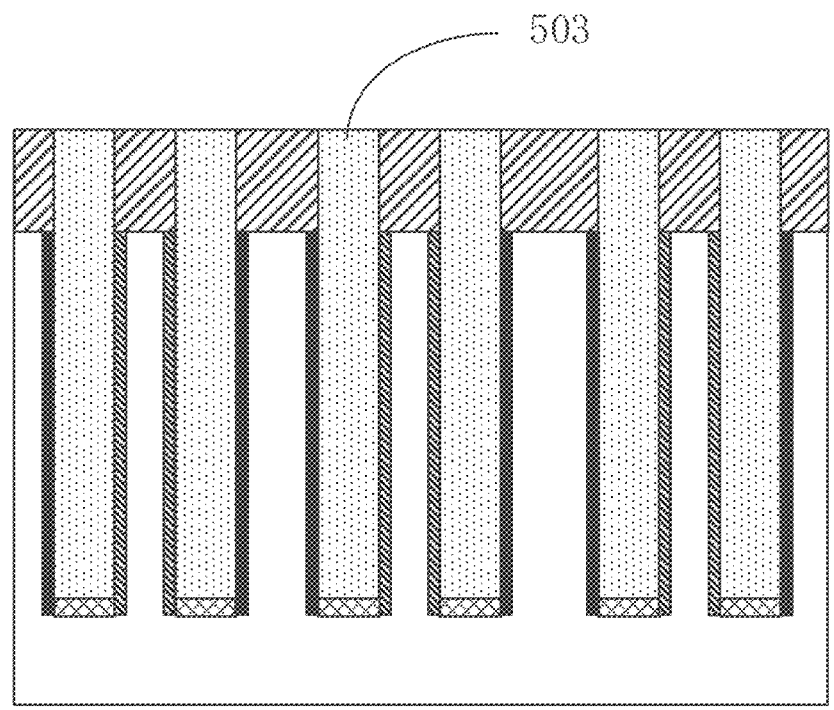

At the step 5012, the channel layers are formed within the grooves as shown in FIGS. 5LA and 5LB. The channel layers 503 are formed on the nucleation layers 502 by epitaxial growth. As to the epitaxial growth, it is difficult to control the horizontal growth. Therefore, it is hard to keep a semiconductor structure growing completely vertically because of occurrence of multiple growth surfaces. The structure related to the present disclosure can keep continuous growth on the same surface and the electrical properties of the device can be improved. The growth in traditional devices is usually in the vertical direction from bottom to top. The structure related to the present disclosure is grown horizontally, which makes the device smoother.

In some embodiments, it may include the step of forming the buffer layers on the nucleation layers before the step of 5012. The buffer layers are formed by epitaxial growth on nucleation layer 502. As mentioned in the above, the buffer layers are not necessary in the structure of some semiconductor devices of the present disclosure. In essence, the buffer layers and the channel layers are very similar in nature and can even be the same material. In other words, the basic structures are the channel layers/channel supply layers, and there can be the buffer layers between the channel layers and the nucleation layers.

Figure 5M:
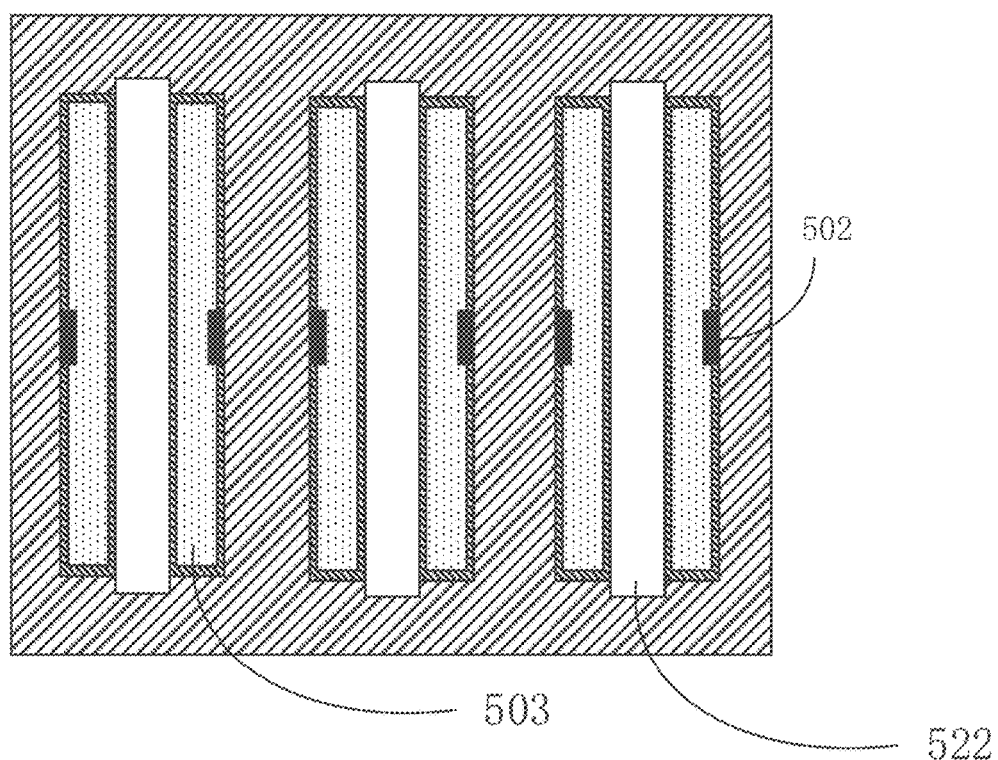
Figure 5M:
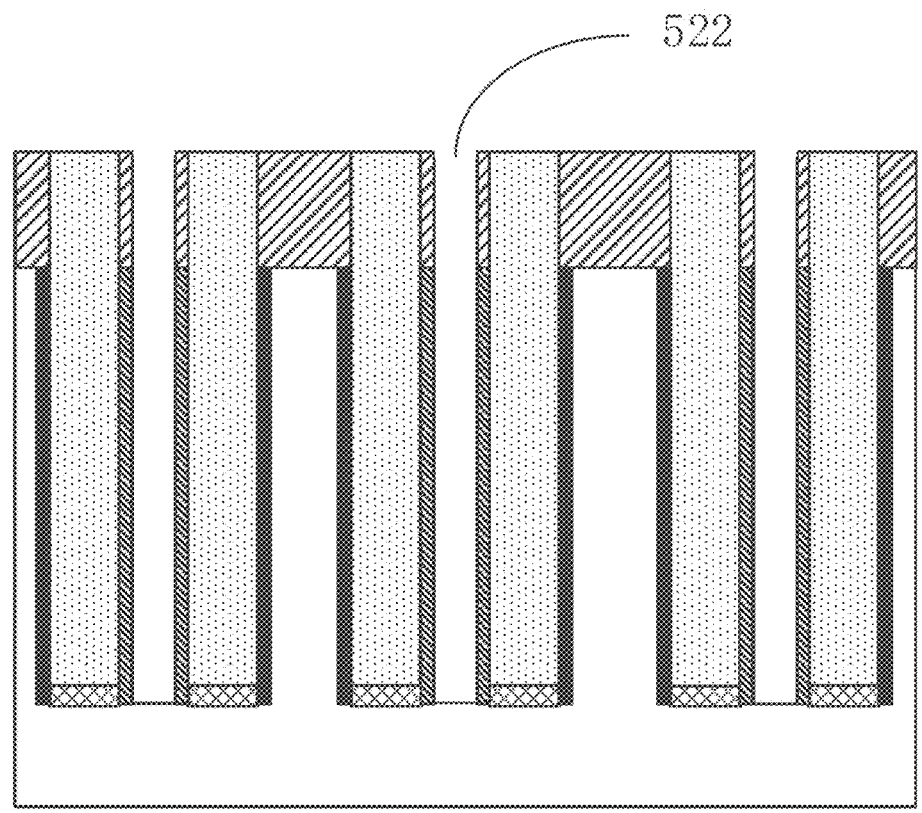

At the step 5013, the second grooves are formed between two neighboring grooves as shown in FIGS. 5MA and 5MB. In some embodiments, the blocking layers 511 and the substrate 501 thereunder between neighboring grooves are etched to form the second grooves 522. In some embodiments, the length of the grooves 522 are bigger than that of the grooves 521, referring to FIG. 5MA.

Figure 5N:
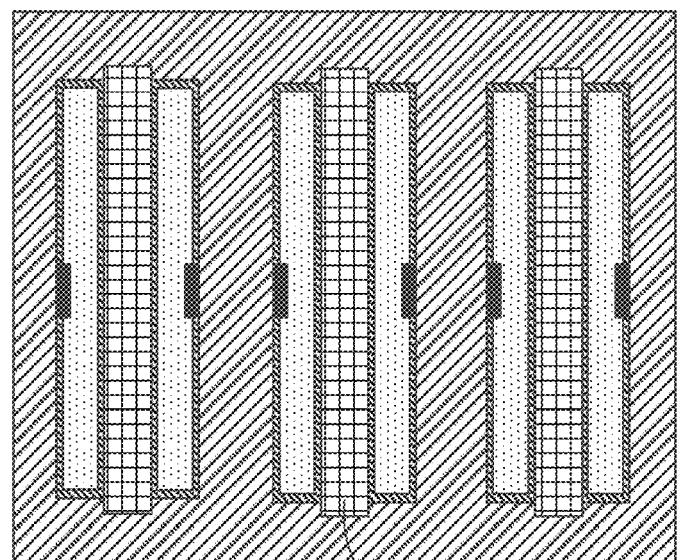
Figure 5N:
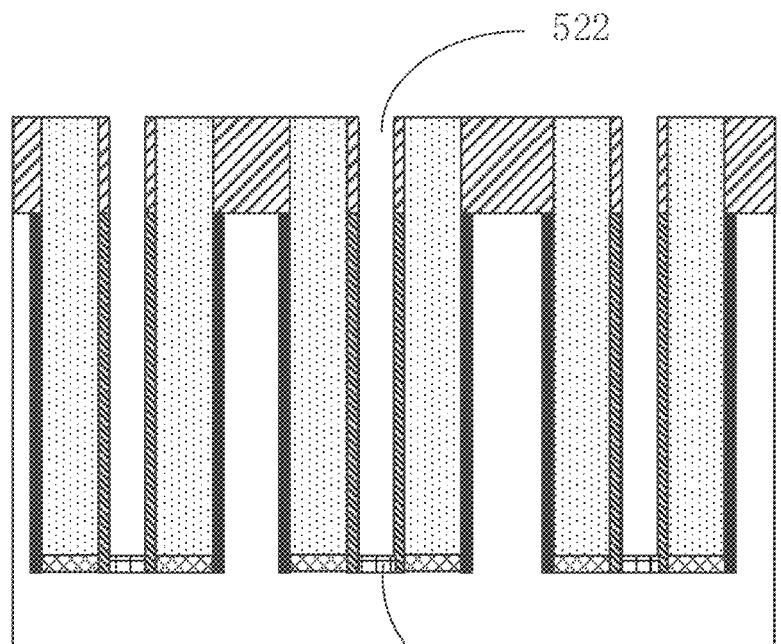
Figure 50A:
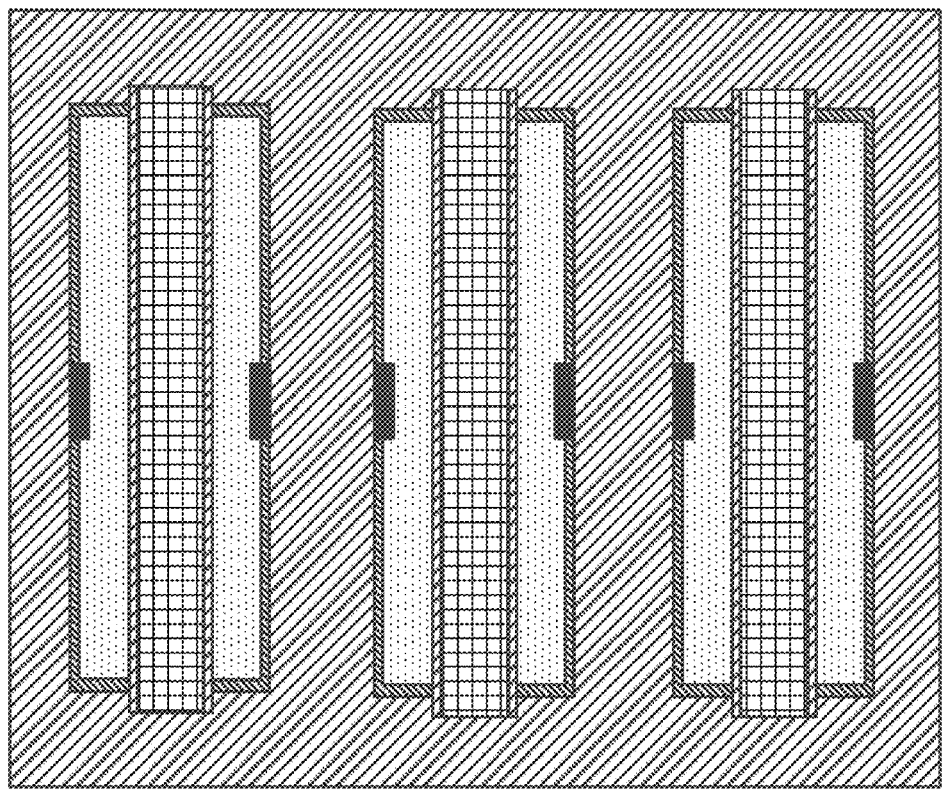
Figure 50B:
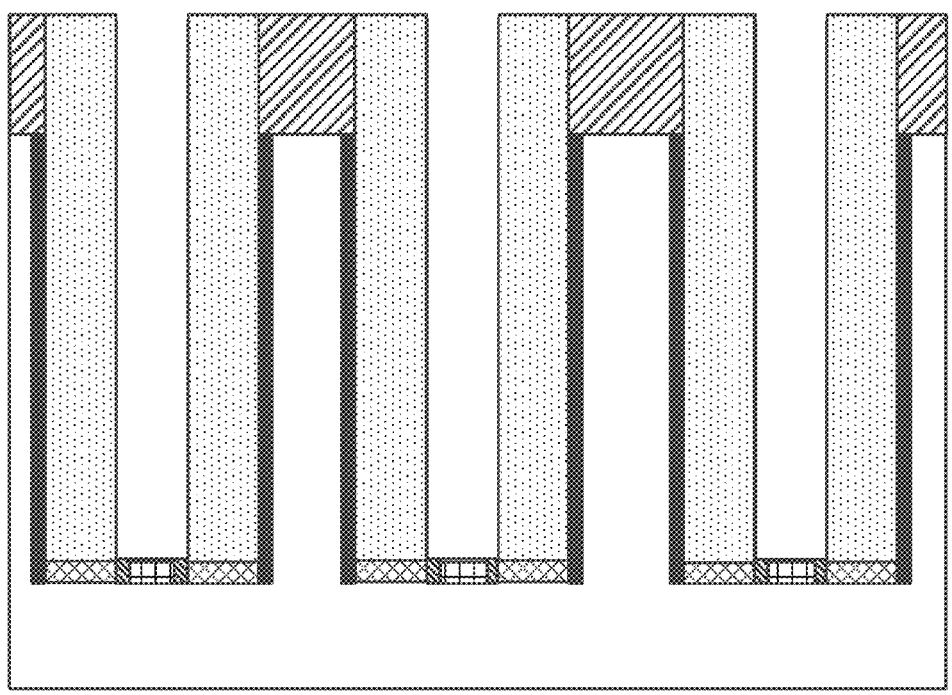

At the step 5014, the second separating layers are formed on the bottom of the second grooves as shown in FIGS. 5NA and 5NB. In some embodiments, the screening layers 513 are formed on the bottom of the second grooves 522 by oxidation technology.

At the step 5015, the blocking layers and separating layers on the sidewall of the second grooves are etched and the vertical surfaces of the two sides of the channel layers are exposed as shown in FIGS. 5OA and 5OB. The blocking layers 511 and the separating layers 512 on the sidewall of the second grooves 522 are etched by etching technology, which makes the two sides of the channel layers 503 in the second grooves 522 are exposed. The blocking layers 511 and the separating layers 512 on the bottom of the second grooves 522 between the second grooves and the substrate 501 are retained during the etching.

Figure 5P:
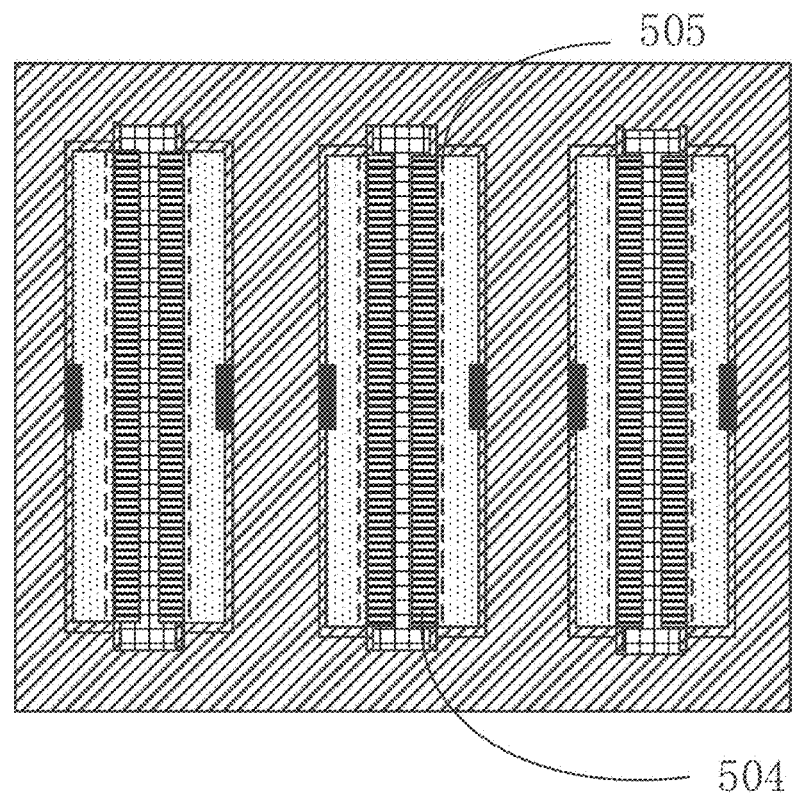
Figure 5P:
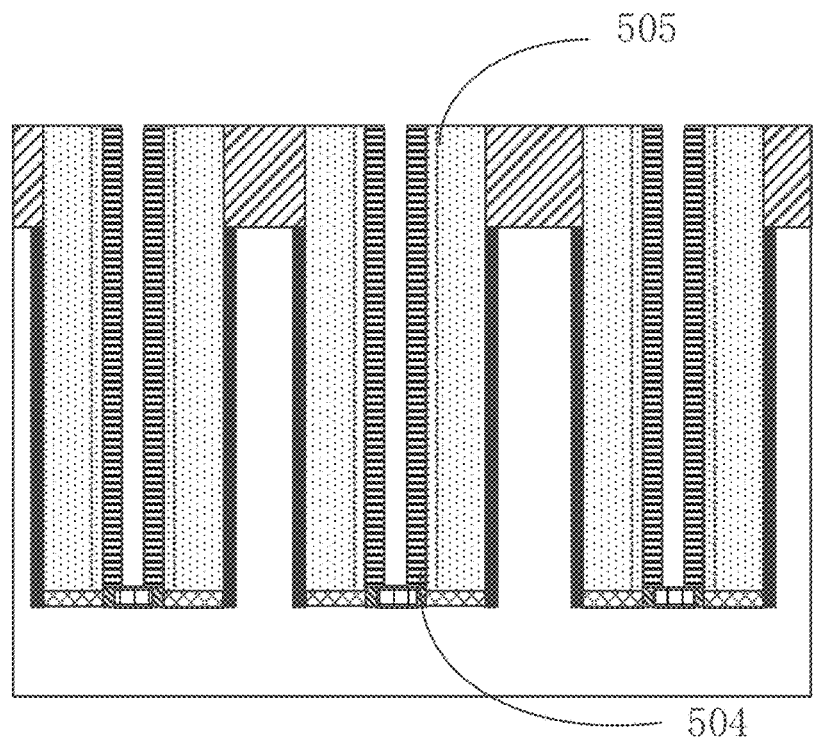

At the step 5016, the barrier layers are formed within the second grooves as shown in FIGS. 5PA and 5PB. The barrier layers 504 are formed within the second grooves 522. In some embodiments, the barrier layers 504 grown may fill the second grooves 522 and then the screening layers may be formed by etching third grooves. In an embodiment, it is selected to epitaxially grow the two barrier layers from the channel layers at both sides of the second grooves 522 and retain the room between the two barriers so as to save the processes and avoid destruction of unnecessary etching to the crystal structure.

Figure 5Q:
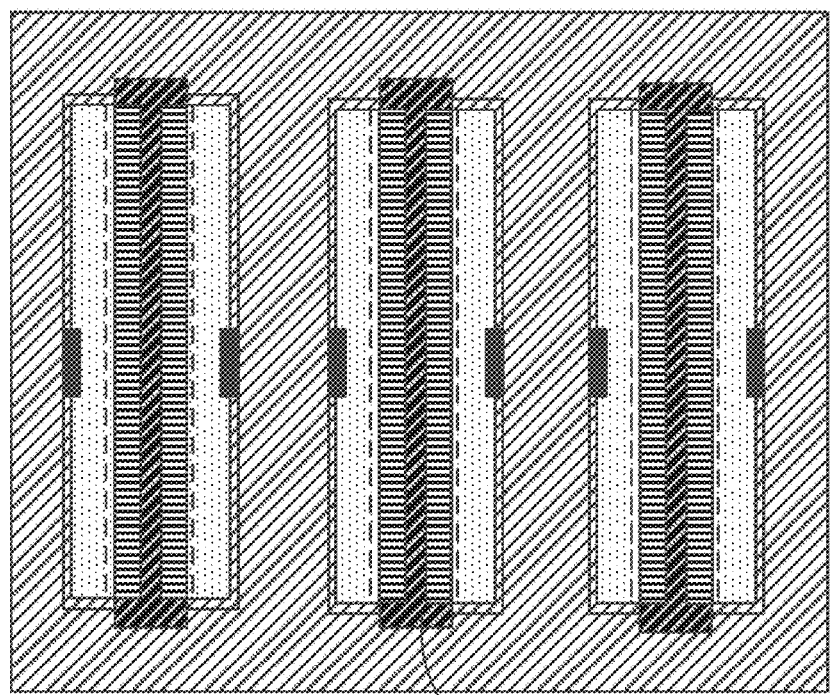
Figure 5Q:
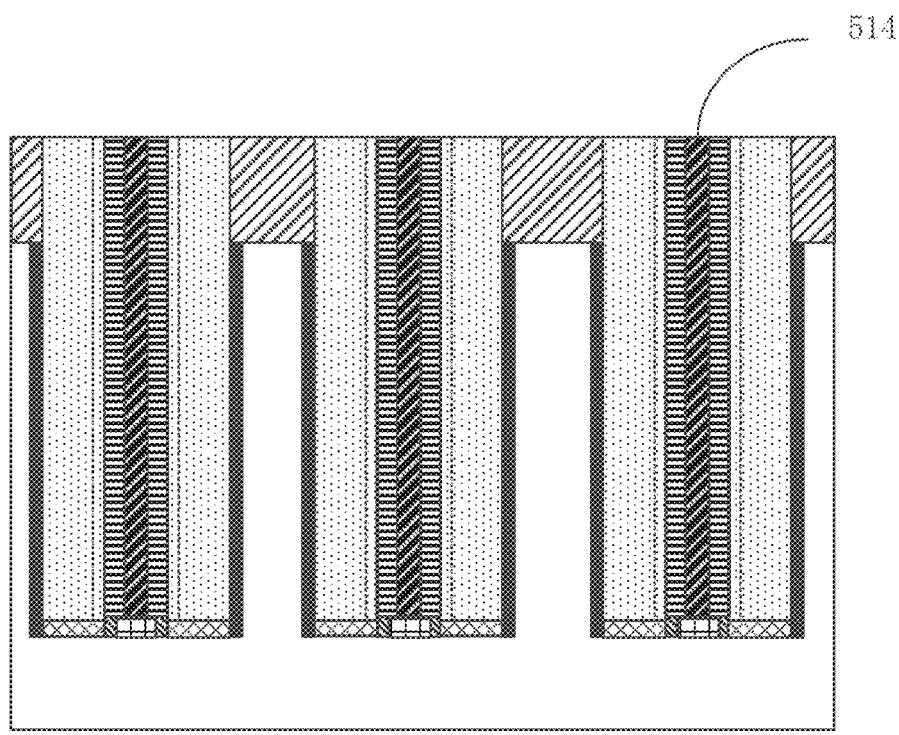

At the step 5017, the screening layers are formed between the two barrier layers as shown in FIGS. 5QA and 5QB. For example, the screening layers 514 are formed within the grooves 522 by deposition. In this way, considering both neighboring two first groove and second groove, they consist of a bigger groove together, similar to the groove 321 in FIGS. 3A and 3B. Most structures of the semiconductor device of the present disclosure are located in this bigger groove.

In some embodiments, the second grooves 522 are longer than the first grooves 521. Because of results of selective growth of the barrier layers, the barrier layers will not fill the areas at the two ends of the second grooves 522 longer than the first grooves 521. Therefore, the "T" shaped rooms will be formed at the two ends of the barrier layers. When forming the screening layers 514 in step 5017, the screening layer 514 will fill the "T" shaped rooms at the two ends of the barrier layers. In some embodiments, the "T" shaped screening layers embrace the sides of the barrier layers and make it further separated from the substrate. Such structures of the screening layers 514 can facilitate not only arrangement of electrodes but also separation of the electrodes from the substrate, which improves the performance of the semiconductor device.

Figure 5R:
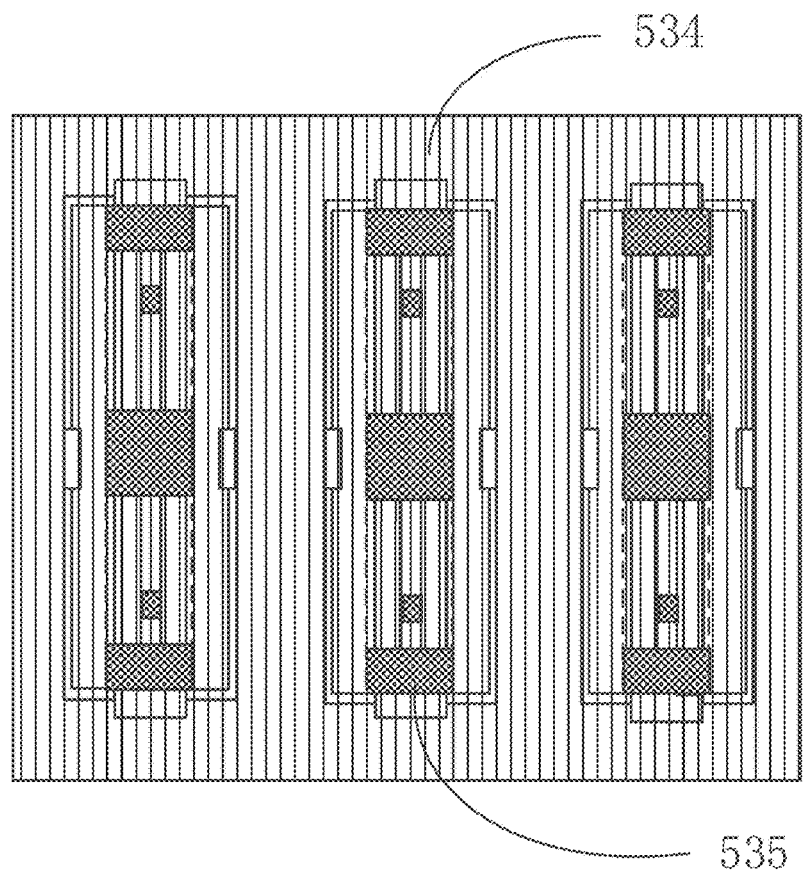
Figure 5R:
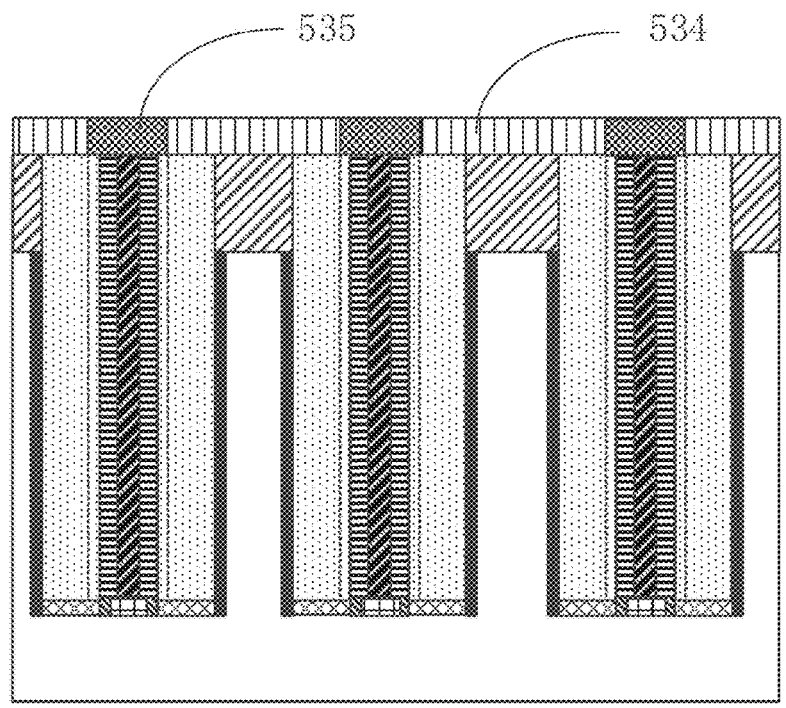

At the step 5018, the mask covers, and the mask holes are left at the positions of the electrodes as shown in FIGS. 5RA and 5RB. The mask 534 covers on the blocking layers 511. The mask holes 535 are set on the mask 534. The first electrodes, the second electrodes and the third electrodes may all be defined in this step. The first electrodes and the second electrodes may be electrically connected with the 2DEG at the two sides. In an embodiment, the third electrodes between the first electrodes and the second electrodes are positioned within the screening layers 514. In this way, the screening layers 514 may be regarded as the gate insulating layers of the third electrodes.

Figure 5S:
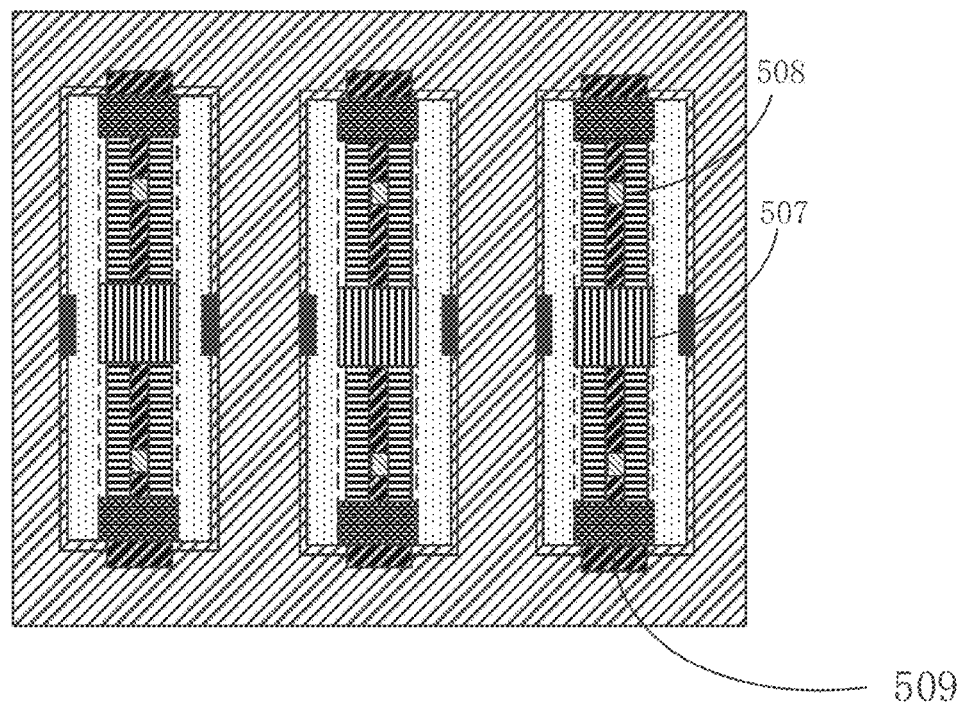
Figure 5S:
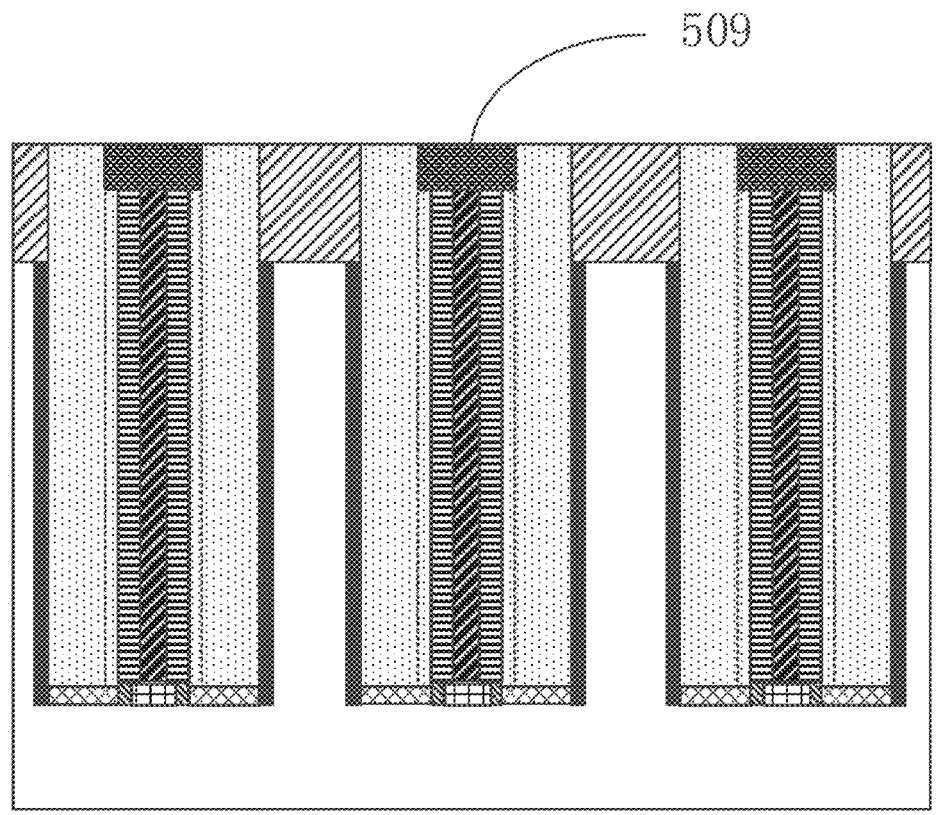

At the step 5019, the first electrodes, the second electrodes and the third electrodes are formed as shown in FIGS. 5SA and 5SB. At first, the screening layers 514 under the positions of the third electrodes are etched and the etching depth is not lower than the height of the 2DEG. The first electrode 507 is formed at the position of the first electrode, the second electrode 508 is formed at the position of the second electrode using electrode deposition methods and the first electrode 507 and the second electrode 508 are made to be electrically connected with the two 2DEG 505. The third electrode 509 is formed at the position of the third electrode and the height of the third electrode 509 is not smaller than that of the 2DEG such that the third electrode can effectively control the current intensity between the first electrode 507 and the second electrode 508. In some embodiments, the materials of the first electrode 507, the second electrode 508, and the third electrode 509 are not the same and three electrodes are respectively made in two phrases.

In some embodiments, the step 5019 also comprises forming the fourth electrode 524 and the fifth electrode 525. At the same time when forming the first electrode 507 and the second electrode 508, the fourth electrode may be formed. At the same time when forming the third electrode 509, the fifth electrode may be formed. In some embodiments, the first electrode 507, the second electrode 508, the third electrode 509, the fourth electrode 524, and the fifth electrode 525 can be formed at the same time to simply the processes.

In some embodiments, the electrode deposition methods may be electron beam evaporation physical deposition, chemical vapor deposition, atom layer deposition, or electrochemical deposition. The electrode material is usually metal. In some embodiments, it will also be deposition on the top surface besides the bottom during the electrode deposition. The undesired metal layers on the top surface may be removed by etching.

In some embodiments, as shown in the structure of FIG. 5SA, the capability of voltage withstanding of the semiconductor device is improved as the blocking layer 511 covers the top surface of the substrate 501. To further improve the performance of the semiconductor device, the electrode parts may be modified. As to one or more of the electrodes 507, 508, and 509, for example the second electrode 508 and the fourth electrode 524 which is usually used as the source, at the step 5020, the blocking layers and the substrate thereunder may be etched to keep the electrodes away from the substrate and then the passivating protection layers of $SiO_2$ and so on may be formed by passivation. In another embodiments, all the substrate which are the sidewalls of the grooves may be removed and then the sidewalls of the grooves are formed again by passivating protection layers. This can further diminish the influence of the substrate sidewalls. In another embodiments, the substrate under the bottom of the grooves may be removed. The removal of the substrate under the bottom of the grooves from the final products will further improve the performance of the products.

The manufacturing method of the device related to the present disclosure, by limitation of the grooves, may form the device structures for example big ratio of height to width which are difficult to be realized by common manufacturing processes and the manufacturing flowchart are simpler. Furthermore, in some embodiments of the present disclosure, the method of the present disclosure may be implemented with the Si substrate with low cost and matured manufacturing processes, which makes the method of the present disclosure advantageous on the cost.

Figure 6:
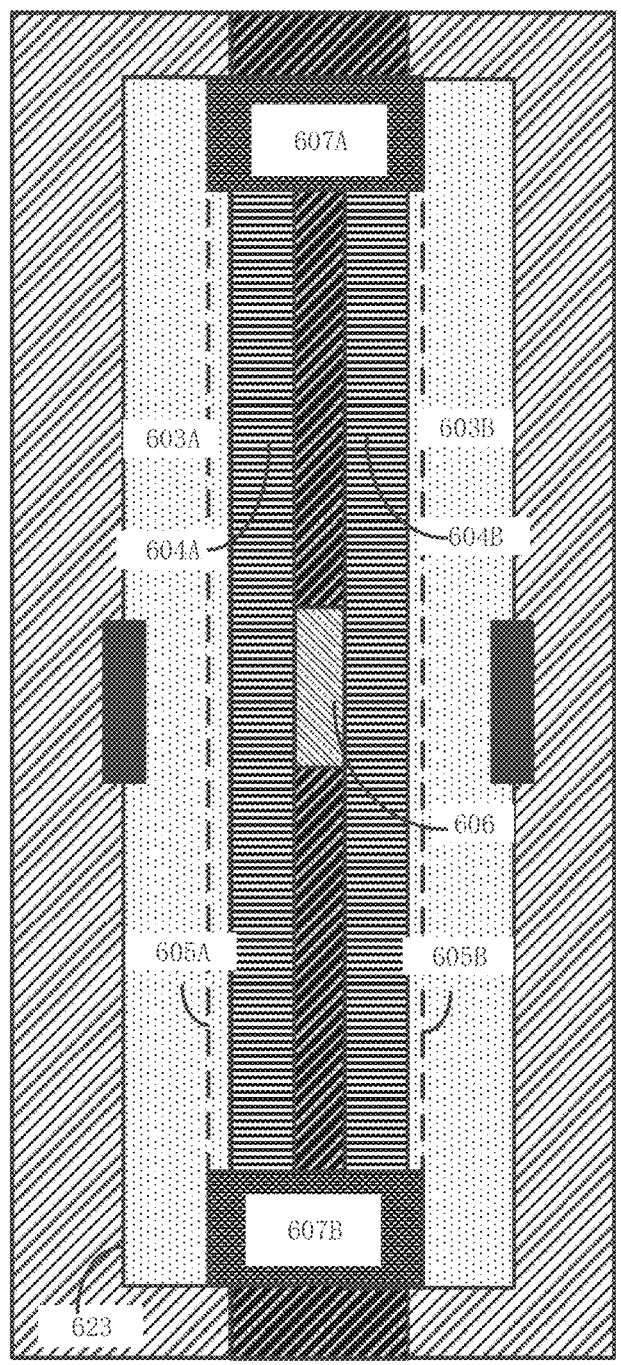
FIG. 6 is a schematic diagram of a Schottky diode according to an embodiment of the present disclosure.

FIG. 6 is a schematic diagram of a Schottky diode according to an embodiment of the present disclosure, wherein structures which are the same as or similar to those shown in FIGS. 4A and 4B are not repeated. There are not the first, second, and third electrodes in the embodiment of FIG. 6. They are the cathodes 607A and 607B the anode 606, wherein the cathodes 607A and 607B are connected to the 2DEG in ohmic contact and the anode 606 is connected to the 2DEG in Schottky contact.

In some embodiments, the cathodes 607A and 607B are provided on the barrier layers and are connected to the 2DEG in ohmic contact. The anode 606 is provided on the barrier layers or the screening layer connected to the 2DEG in Schottky contact. The ohmic contact between the cathodes 607A and 607B and the 2DEG are conductive in dual directions. The Schottky contact between the anode 606 and the 2DEG is conductive in single direction. Therefore, there is also single direction conductivity between the cathode 607A and the anode 606 and between the cathode 607B and the anode 606. That is, the current can only flow from the anode 606 to the cathodes 607A and 607B.

The above structure is only exemplarily description of the technical solution of the present disclosure. In some embodiments, more semiconductor devices can be included in the same groove, providing higher integrity solution.

Figure 7:
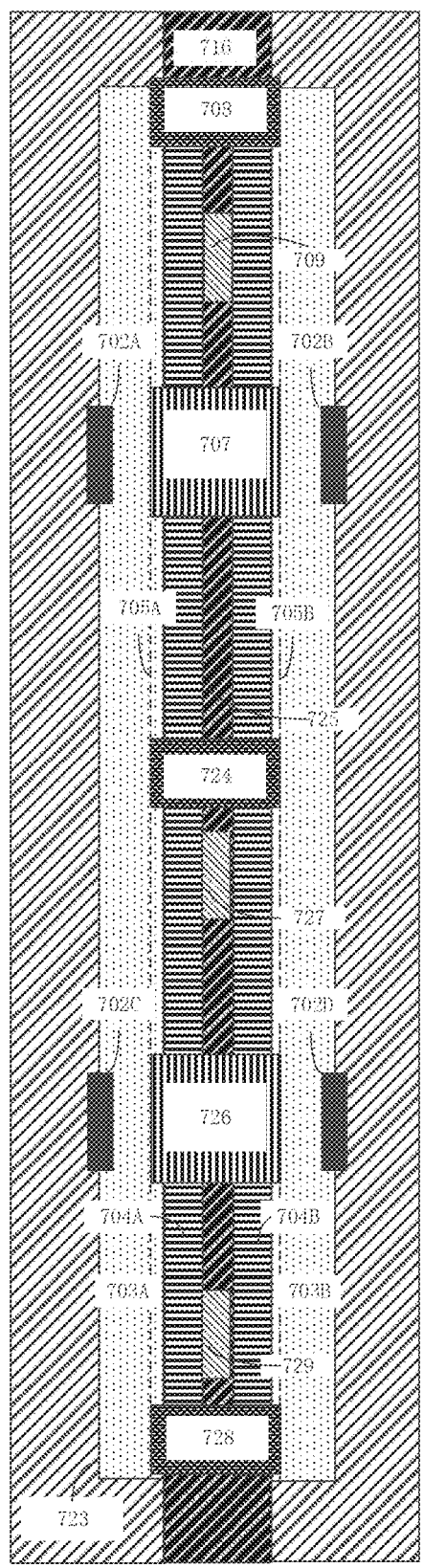
FIG. 7 is a schematic diagram of a long-groove HEMT according to an embodiment of the present disclosure.

FIG. 7 is a schematic diagram of a long-groove HEMT according to an embodiment of the present disclosure. As shown in FIG. 7, the channel layers 703A and 703B, the barrier layers 704A and 704B, 4 nucleation layers 702A-702D, 4 gate electrodes 705, 725, 727 and 729, 3 source electrodes 708, 724, and 728, and 2 drain electrodes 707 and 726 are included in a long groove 723. In comparison with the structure of FIG. 3A, the long groove 723 in the long-groove HEMT of FIG. 7 is longer, and therefore it has longer channel layers, barrier layers, and 2DEG. It can be considered that the structure of FIG. 7 is formed by "jointing" of two structures of FIG. 3A. Four HEMT 100 of FIG. 3A are included in a long groove of FIG. 7. The structure of FIG. 7 can save on-wafer area, significantly improve usage rate of the Si wafer, and further enhance structural integrity.

Figure 8:
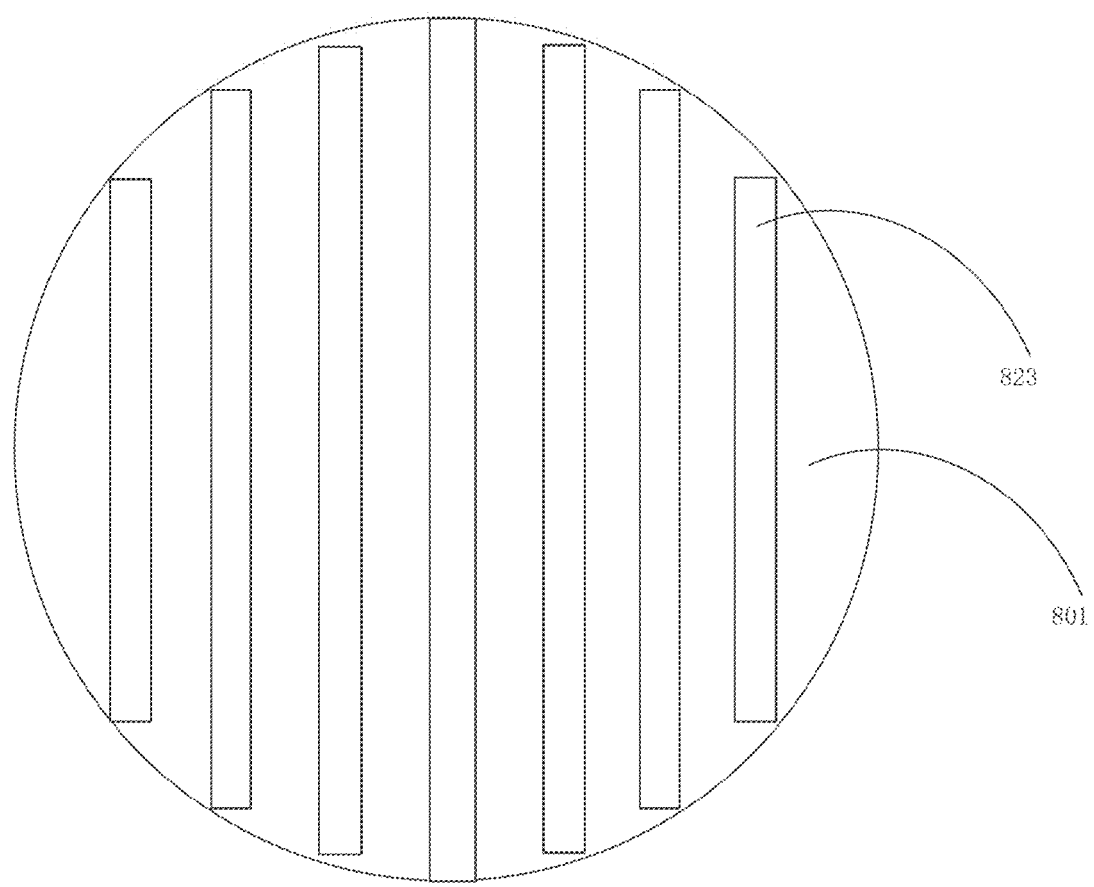
FIG. 8 is a schematic diagram of long grooves on a Si wafer according to an embodiment of the present disclosure.

FIG. 8 is a schematic diagram of long grooves on a Si wafer according to an embodiment of the present disclosure. As shown in the figure, there are a plurality of long grooves 823 on the wafer 801, wherein the long grooves 823 are arranged in parallel. One or more kinds of desire semiconductor devices are formed in every long grooves 823 by the methods described in the above, which can make the wafer used adequately.

The above-described embodiments are merely illustrative of the present disclosure, and are not intended to limit the present disclosure. Various changes and modifications may also be made by those skilled in the art without departing from the scope of the present disclosure. Therefore, all the equivalent technical solutions should also fall within the scope of the present disclosure.

What is claimed is:

1. A semiconductor device, comprising:
a groove, wherein at least a part of a sidewall of the groove is a (111) plane of Si, a (0001) plane of sapphire $Al_2O_3$, a (0001) or (000-1) plane of SiC, or a (0001) or (000-1) plane of intrinsic GaN;
a first channel layer positioned within the groove;
a first barrier layer positioned within the groove, wherein a first heterojunction having a vertical interface is included between the first channel layer and the first barrier layer and a 2DEG or 2DHG is formed in the first heterojunction;
a second channel layer and a second barrier layer, wherein a second heterojunction having a vertical interface is included between the second channel layer and the second barrier layer and a 2DEG or 2DHG is formed in the second heterojunction; and
a screening layer between the first channel layer or the first barrier layer and the second channel layer or the second barrier layer.

2. The semiconductor device according to claim 1, wherein the first channel layer and the first barrier layer are two kinds of nitride semiconductor with different forbidden band widths.

3. The semiconductor device according to claim 1, further comprising a substrate positioned under the groove.

4. The semiconductor device according to claim 3, wherein at least a part of a sidewall of the groove is a part of the substrate.

5. The semiconductor device according to claim 3, wherein the substrate is Si.

6. The semiconductor device according to claim 5, wherein a nucleation layer is included in the groove.

7. The semiconductor device according to claim 1, further comprising a first separating layer formed between a bottom of the groove and the first channel layer.

8. The semiconductor device according to claim 1, further comprising a second separating layer formed between a bottom of the groove and the first barrier layer.

9. The semiconductor device according to claim 1, further comprising
a first electrode being electrically connected with the 2DEG or 2DHG of the first heterojunction; and
a second electrode being electrically connected with the 2DEG or 2DHG of the first heterojunction;
wherein one of the first electrode and the second electrode is in Schottky contact and the other is in ohmic contact.

10. The semiconductor device according to claim 1, further comprising
a first electrode being electrically connected with the 2DEG or 2DHG of the first heterojunction;
a second electrode being electrically connected with the 2DEG or 2DHG of the first heterojunction; and
a third electrode between the first electrode and the second electrode, configured to control current intensity between the first electrode and the second electrode.

11. The semiconductor device according to claim 10, further comprising a gate insulating layer positioned between the third electrode and the first heterojunction.

12. The semiconductor device according to claim 1, wherein a blocking layer is included on a sidewall of the groove adjacent to an electrode.

13. The semiconductor device according to claim 1, further comprising a spacing layer formed on a bottom of the groove under the screening layer, the spacing layer extending horizontally.

14. The semiconductor device according to claim 1, further comprising
a first electrode being electrically connected with the 2DEG or 2DHG of the first heterojunction and the 2DEG or 2DHG of the second heterojunction; and
a second electrode being electrically connected with the 2DEG or 2DHG of the first heterojunction and the 2DEG or 2DHG of the second heterojunction;
wherein one of the first electrode and the second electrode is in Schottky contact and the other is in ohmic contact.

15. The semiconductor device according to claim 1, further comprising
a first electrode being electrically connected with the 2DEG or 2DHG of the first heterojunction and the 2DEG or 2DHG of the second heterojunction;
a second electrode being electrically connected with 2DEG or 2DHG of the first heterojunction and the 2DEG or 2DHG of the second heterojunction; and
a third electrode between the first electrode and the second electrode, configured to control current intensity between the first electrode and the second electrode.

16. A method of manufacturing a semiconductor device, comprising
forming a first groove in a substrate wherein at least a part of the sidewall of the groove is a (111) plane of Si, a (0001) plane of sapphire Al2O3, a (0001) or (000-1) plane of SiC, or a (0001) or (000-1) plane of intrinsic GaN;
forming a first channel layer within the first groove;
forming a second groove in the substrate, the second groove having a side of the first channel layer exposed; and
forming a first barrier layer within the second groove, wherein a first heterojunction having a vertical interface is included between the first channel layer and the first barrier layer and a 2DEG or 2DHG is formed in the first heterojunction;
forming a third groove in the substrate;
forming a second channel layer within the third groove;
forming a fourth groove in the substrate, the fourth groove having a side of the second channel layer exposed;
forming a second barrier layer within the fourth groove, wherein a second heterojunction having a vertical interface is included between the second channel layer and the second barrier layer and a 2DEG or 2DHG is formed in the second heterojunction; and
forming a screening layer between the first channel laver/the first barrier layer and the second channel laver/the second barrier layer.

17. The method according to claim 16, further comprising forming a first separating layer on the bottom of the first groove.

18. The method according to claim 16, further comprising forming a second separating layer on the bottom of the second groove.

19. The method according to claim 16, further comprising forming a first spacing layer on a sidewall of the first groove.

20. The method according to claim 16, further comprising forming a second spacing layer on a sidewall of the second groove.

21. The method according to claim 16, further comprising
forming a first electrode being electrically connected with the 2DEG or 2DHG of the first heterojunction; and
forming a second electrode being electrically connected with the 2DEG or 2DHG of the first heterojunction;
wherein one of the first electrode and the second electrode is in Schottky contact and the other is in ohmic contact.

22. The method according to claim 16, further comprising
forming a first electrode being electrically connected with the 2DEG or 2DHG of the first heterojunction;
forming a second electrode being electrically connected with the 2DEG or 2DHG of the first heterojunction; and
forming a third electrode between the first electrode and the second electrode, configured to control current intensity between the first electrode and the second electrode.

23. The method according to claim 22, further comprising forming a gate insulating layer between the first heterojunction and the third electrode before forming the third electrode.

24. The method according to claim 16, further comprising
etching off all or a part of a substrate as a sidewall of the first groove and/or the second groove; and
forming a screening layer as the sidewall of the first groove and/or the second groove.

25. The method according to claim 16, further comprising forming a spacing layer on the bottom of the groove under the screening layer, wherein the spacing layer extends horizontally.

26. The method according to claim 16, further comprising
forming a first electrode being electrically connected with the 2DEG or 2DHG of the first heterojunction and the 2DEG or 2DHG of the second heterojunction; and
forming a second electrode being electrically connected with the 2DEG or 2DHG of the first heterojunction and the 2DEG or 2DHG of the second heterojunction;

wherein one of the first electrode and the second electrode is in Schottky contact and the other is in ohmic contract.

27. The method according to claim 16, further comprising forming a first electrode being electrically connected with the 2DEG or 2DHG of the first heterojunction and the 2DEG or 2DHG of the second heterojunction;

forming a second electrode being electrically connected with the 2DEG or 2DHG of the first heterojunction and the 2DEG or 2DHG of the second heterojunction; and forming a third electrode between the first electrode and the second electrode, configured to control current intensity between the first electrode and the second electrode.

\* \* \* \* \*